(12) United States Patent
Sakata et al.

(10) Patent No.: US 8,444,363 B2
(45) Date of Patent: May 21, 2013

(54) SUBSTRATE PROCESSING APPARATUS

(75) Inventors: Masakazu Sakata, Toyama (JP); Akira Takahashi, Toyama (JP); Hidehiro Yanai, Toyama (JP); Motonari Takebayashi, Takaoka (JP); Shinya Tanaka, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 239 days.

(21) Appl. No.: 12/619,050

(22) Filed: Nov. 16, 2009

(65) Prior Publication Data

US 2010/0150687 A1 Jun. 17, 2010

(30) Foreign Application Priority Data

Nov. 26, 2008 (JP) ................... 2008-301163
Nov. 27, 2008 (JP) ................... 2008-302869
Nov. 6, 2009 (JP) ................... 2009-254923

(51) Int. Cl.
*H01L 21/677* (2006.01)
(52) U.S. Cl.
USPC .......................................... 414/217; 414/935
(58) Field of Classification Search
USPC .......... 414/217, 935, 222.07, 222.12, 222.13, 414/222.09
See application file for complete search history.

(56) References Cited

U.S. PATENT DOCUMENTS

| 5,483,138 A | * | 1/1996 | Shmookler et al. ...... 318/568.16 |
| 6,647,665 B1 | * | 11/2003 | Tabrizi et al. .................... 49/340 |
| 2008/0219824 A1 | * | 9/2008 | Newman et al. ........... 414/744.5 |
| 2009/0143911 A1 | * | 6/2009 | Gage et al. ..................... 700/248 |

* cited by examiner

*Primary Examiner* — Saul Rodriguez
*Assistant Examiner* — Glenn Myers
(74) *Attorney, Agent, or Firm* — Brundidge & Stanger, P.C.

(57) ABSTRACT

Provided is a substrate processing apparatus configured to attain conflicting purposes of high throughput and footprint reduction. The substrate processing apparatus comprises a carrying chamber, and a loadlock chamber and at least two process chambers that are arranged around the carrying chamber. The carrying chamber comprises a substrate carrying unit configured to carry a substrate between the loadlock chamber and the process chambers. The substrate carrying unit comprises a first arm provided with a first finger and a second finger, and leading ends of the first and second fingers extend horizontally in the same direction. Each of the process chambers comprises a first process unit and a second process unit, and the second process unit is disposed at a side of the process chamber distant from the carrying chamber with the first process unit being disposed therebetween.

5 Claims, 33 Drawing Sheets

Fig. 16
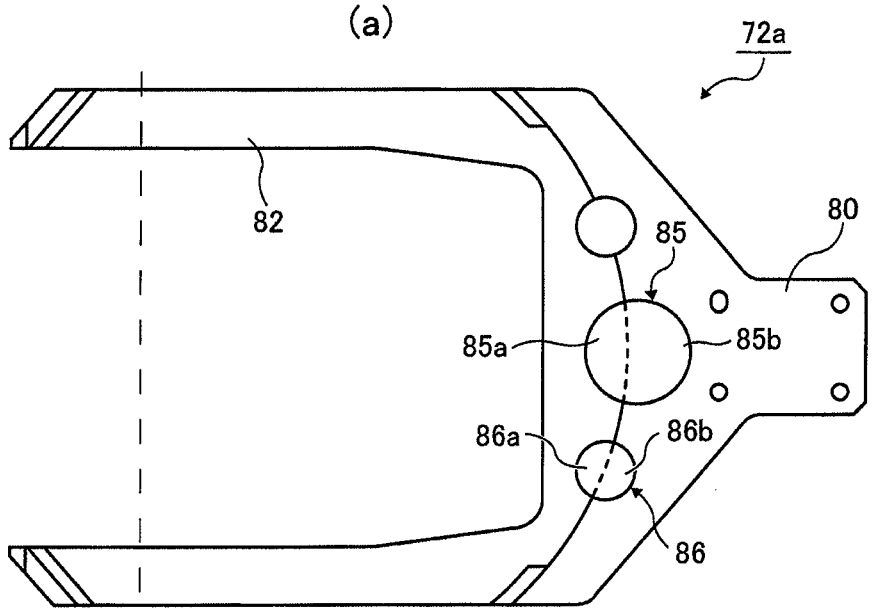
(a)
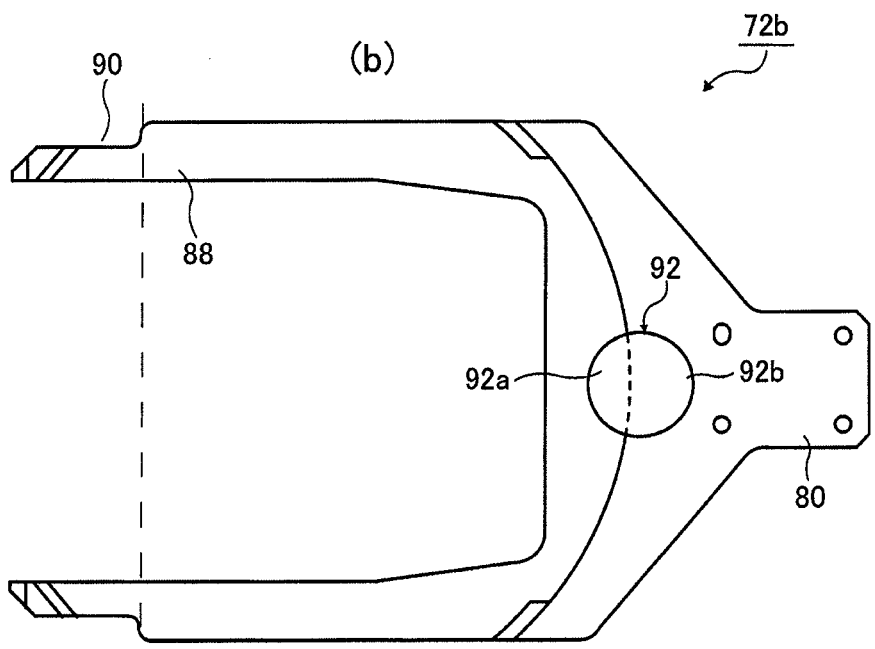
(b)

Fig. 18
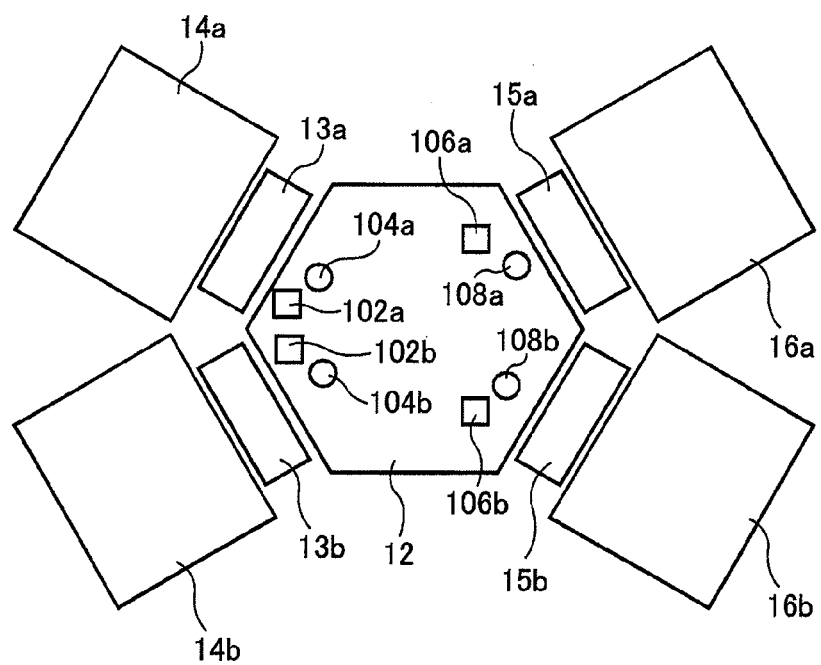
(a)
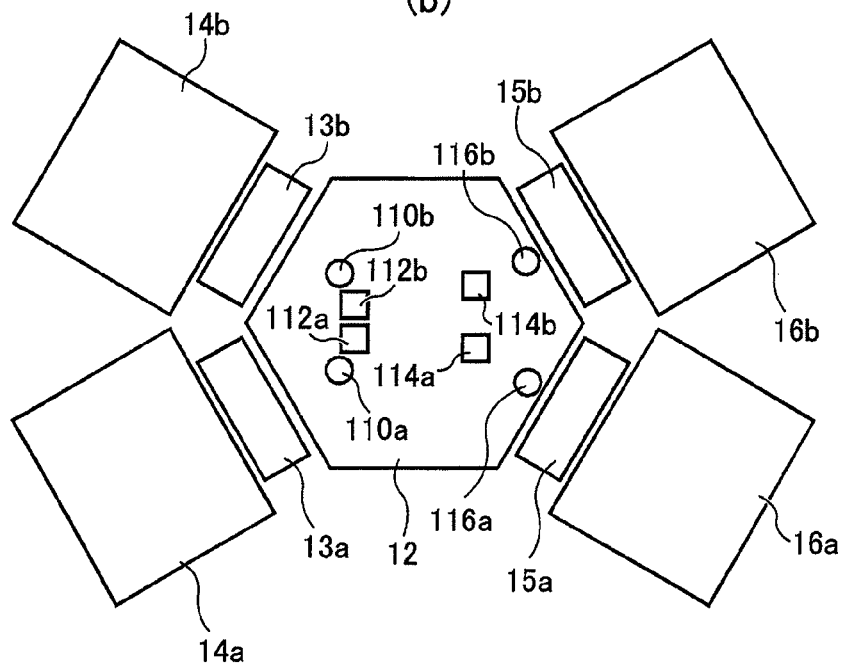
(b)

Fig. 31
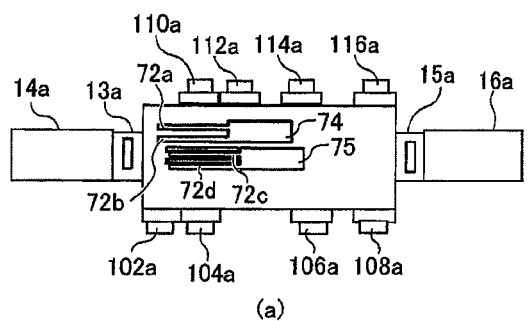
(a)
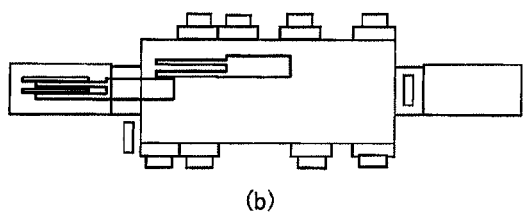
(b)
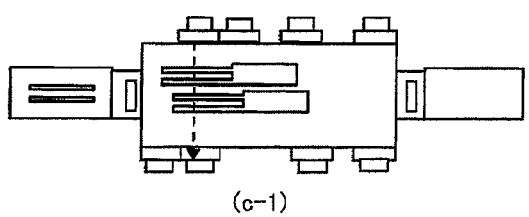
(c-1)
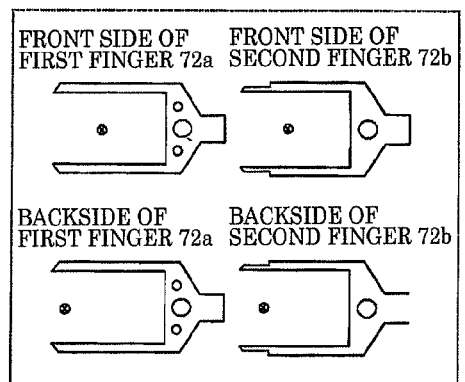
(c-2)

SUBSTRATE PROCESSING APPARATUS

CROSS-REFERENCE TO RELATED PATENT APPLICATION

This U.S. non-provisional patent application claims priority under 35 U.S.C. §119 of Japanese Patent Application Nos. 2008-301163, filed on Nov. 26, 2008, 2008-302869, filed on Nov. 27, 2008, and 2009-254923, filed on Nov. 6. 2009, in the Japanese Patent Office, the entire contents of which are hereby incorporated by reference.

BACKGROUND OF THE INVENTION

1. Field of the Invention

The present invention relates to a substrate processing apparatus.

2. Description of the Prior Art

For example, in a substrate processing apparatus, a wafer is sequentially carried along a load port, a loadlock chamber, a carrying chamber, and a process chamber, and is then processed in the process chamber.

Process chambers are separate spaces shielded by using gate valves, and wafers can be individually processed in the respective process chambers.

Generally, when a processing process is performed on substrate holding stages, only one wafer is processed in each chamber. Patent Document 1 discloses a technique necessary, in the case where non-processed wafers are sequentially carried to process chambers and processed wafers are carried from the respective process chambers to substrate supporters, for replacing a processed wafer with the next wafer to be processed.

[Patent Document 1] Japanese Unexamined Patent Application Publication No. 2006-86180

A conventional substrate processing apparatus includes two loadlock chambers configured to be stocked with wafers, a carrying chamber having a robot configured to transfer wafers to respective chambers, and two process chambers configured to process wafers therein. However, with this structure of the substrate processing apparatus, it is difficult to obtain a throughput higher than 200 wafers per hour. When it is intended to improve the throughput, the intention can be simply accomplished by adding process chambers around the carrying chamber. In this case, however, the size of the transfer robot disposed in the carrying chamber is relatively increased, and moreover the footprint of the substrate processing apparatus is inevitably increased due to the addition of process chambers.

SUMMARY OF THE INVENTION

An object of the present invention is to provide a substrate processing apparatus configured to attain conflicting purposes of high throughput and footprint reduction.

According to an aspect of the present invention, there is provided a substrate processing apparatus comprising a carrying chamber; a loadlock chamber capable of accommodating substrates arranged vertically with an interval therebetween; at least two process chambers; and a controller configured to control each component of the substrate processing apparatus, wherein the loadlock chamber and the at least two process chambers are arranged around the carrying chamber and each of the at least two process chambers comprises a first process unit and a second process unit, the second process unit being disposed at a side of the at least two process chamber distant from the carrying chamber with the first process unit disposed therebetween, and wherein the carrying chamber comprises a substrate carrying unit configured to carry the substrates between the loadlock chamber and the at least two process chambers, the substrate carrying unit comprising: a first arm provided with a first pair of fingers including a first finger and a second finger arranged vertically, each of the first finger and the second finger being fixed to the first arm via a supporting part with a gap therebetween, each of the first finger and the second finger including a wafer resting part configured to carry one of the substrates arranged vertically, the wafer resting part of each of the first finger and the second finger having a leading end extending horizontally, and the wafer resting part of the second finger having a notch at the leading end thereof, the notch overlapping with the leading end of the first finger; and a second arm vertically stacked with respect to the first arm, the second arm provided with a second pair of fingers including a third finger and a fourth finger arranged vertically, each of the third finger and the fourth finger being fixed to the second arm via a support part with a gap therebetween, each of the third finger and the fourth finger including a wafer resting part configured to carry one of the substrates arranged vertically, the wafer resting part of each of the third finger and the fourth finger having a notch at a leading end thereof extending horizontally, the notch of the fourth finger overlapping with the leading end of the third finger.

According to the present invention, conflicting purposes of high throughput and footprint reduction can attained.

BRIEF DESCRIPTION OF THE DRAWINGS

FIG. 16 is a top view illustrating an upper arm of a first substrate carrying member according to the second embodiment of the present invention.

FIG. 18 illustrates top and bottom views of the substrate processing apparatus according to an embodiment of the present invention.

FIG. 31 is a sectional view illustrating the substrate processing apparatus according to the second embodiment of the present invention.

DETAILED DESCRIPTION OF THE PREFERRED EMBODIMENTS

Hereinafter, a first embodiment of the present invention will be described with reference to the attached drawings.

Figure 1:
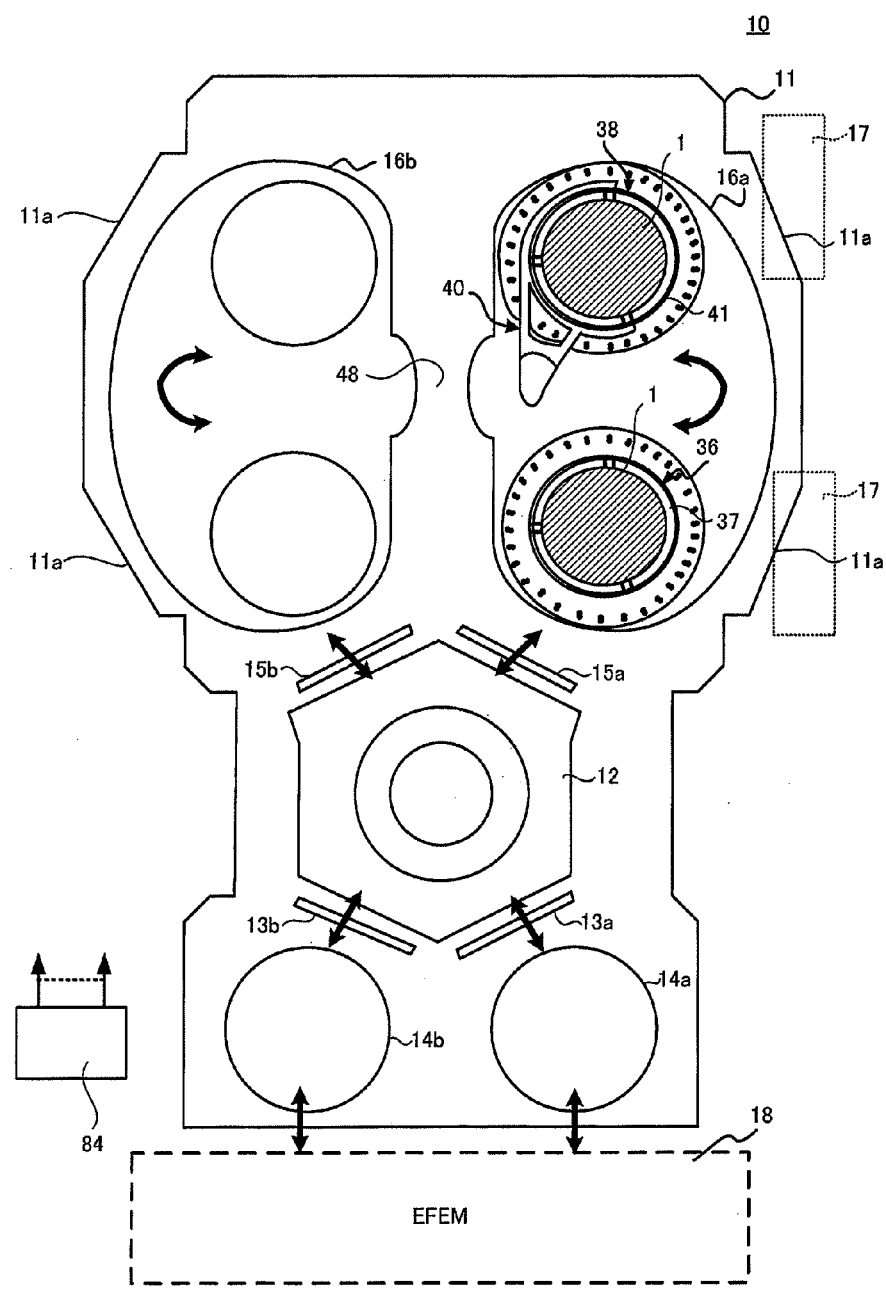
FIG. 1 is a schematic top view illustrating the entire structure of a substrate processing apparatus according to an embodiment of the present invention.

FIG. 1 is a schematic top view illustrating the entire structure of a substrate processing apparatus 10 according to an embodiment of the present invention.

In the substrate processing apparatus 10, for example, two loadlock chambers 14a and 14b and two process chambers 16a and 16b are disposed around a carrying chamber 12, and an equipment front end module (EFEM) 18 is disposed as a front module at the upstream side of the loadlock chambers 14a and 14b.

The EFEM 18 is configured such that three FOUPs each stocked with wafers 1 (twenty five wafers) can be loaded in the EFEM 18.

In the EFEM 18, an atmospheric robot (not shown) capable of transferring a plurality of wafers (five wafers 1) at one time in the atmosphere is disposed, so that wafers can be transferred between the EFEM 18 and the two loadlock chambers 14a and 14b. In addition, the apparatus includes a controller 84 configured to control each component.

Figure 2:
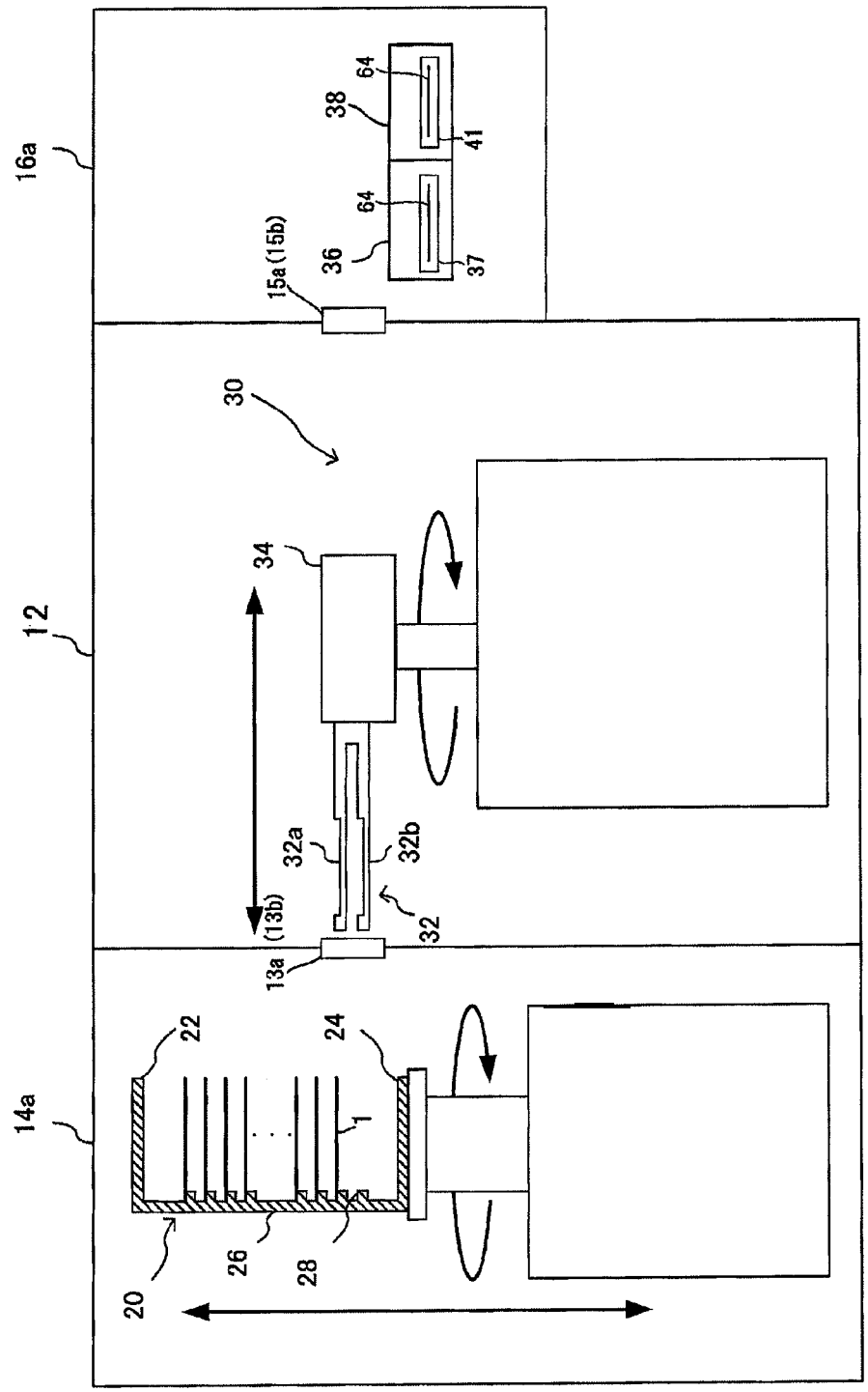
FIG. 2 is a vertical sectional view illustrating the entire structure of the substrate processing apparatus according to a first embodiment of the present invention.

As shown in FIG. 2, in the loadlock chamber 14a (14b), a substrate supporter (boat) 20 is installed, which is capable of accommodating substrates, for example, twenty five substrates, in a manner that the substrates are vertically arranged at regular intervals. The substrate supporter 20 is made of a material such as silicon carbide or aluminum, and the substrate supporter 20 includes pillars 26, for example, three pillars 26, which are configured to connect an upper plate 22 and a lower plate 24. Along the length of the inner side of each pillar 26, for example, twenty five resting parts 28 are formed in parallel with each other. Inside of the loadlock chamber 14a (14b), the substrate supporter 20 is configured to be moved vertically (upwardly and downwardly) and rotated on a vertically-extendable rotation shaft.

At the carrying chamber 12, a first substrate carrying member 30 is installed as a substrate carrying unit configured to carry wafers 1 between the loadlock chambers 14a and 14b and the process chambers 16a and 16b. The first substrate carrying member 30 includes an arm 34 at which a finger pair 32 constituted by an upper finger 32a and a lower finger 32b is installed. The upper finger 32a and the lower finger 32b are spaced a predetermined distanced from each other in a vertical direction and is extended approximately horizontally from the arm 34 in the same direction, so that the upper finger 32a and the lower finger 32b can support wafers 1, respectively. The arm 34 is configured to be rotated about a vertically extendable rotation shaft and be horizontally moved. Between the carrying chamber 12 and the loadlock chamber 14a, a first substrate pass port 13a is installed, and between the carrying chamber 12 and the loadlock chamber 14b, a second substrate pass port 13b is installed. In addition, between the carrying chamber 12 and the process chamber 16a, a third substrate pass port 15a is installed, and between the carrying chamber 12 and the process chamber 16b, a fourth substrate pass port 15b is installed. Gate valves 35 are installed at the substrate pass ports, respectively. The loadlock chambers, the carrying chamber, and the process chambers communicate with one another through the substrate pass ports. The substrate pass ports are fixed to the apparatus.

Therefore, non-processed wafers stocked in the loadlock chambers 14a and 14b can be transferred to the process chambers 16a and 16b through the gate valves 35, two at a time, by using the first substrate carrying member 30 disposed at the carrying chamber 12, and processed wafers can be transferred from the process chambers 16a and 16b to the loadlock chambers 14a and 14b, two at a time, by using the first substrate carrying member 30 (a first substrate carrying mechanism).

Figure 3:
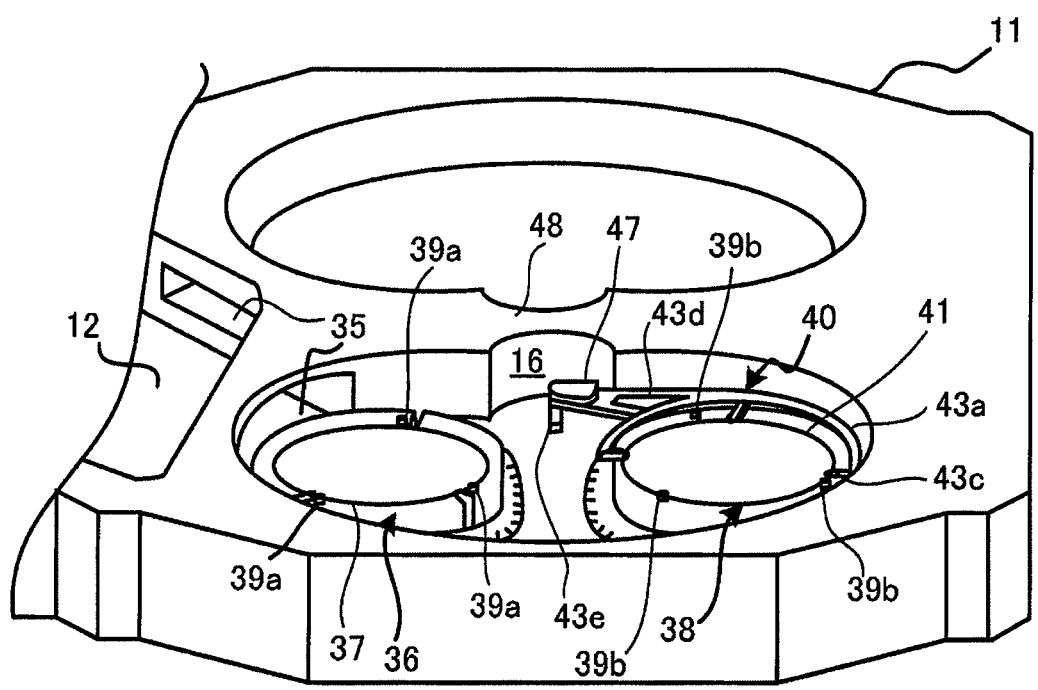
FIG. 3 is a perspective view illustrating a process chamber of the substrate processing apparatus according to an embodiment of the present invention.

FIG. 3 is a schematic view illustrating the process chambers 16.

At each of the process chambers 16, two substrate stages are disposed: a first substrate stage 37 disposed at a first process unit 36 located at a side close to the carrying chamber 12, and a second substrate stage 41 disposed at a second process unit 38 located at a side opposite to the carrying chamber 12.

The first process unit 36 and the second process unit 38 have structures independent of each other, and in the entire view of the apparatus, the first process unit 36 and the second process unit 38 are arranged in a row along a wafer processing flow direction.

In other words, the second process unit 38 is disposed at a position distant from the carrying chamber 12 with the first process unit 36 being disposed therebetween.

At the first process unit 36 and the second process unit 38, substrate processing is performed through the same process.

The first process unit 36 and the second process unit 38 communicate with each other, and the inside of the process chambers 16 can be heated to 300° C.

In the first substrate stage 37 and the second substrate stage 41, as shown in FIG. 2, heaters 64 are inserted for heating. The first substrate stage 37 and the second substrate stage 41 may be made of a material such as aluminum (e.g. A5052 or A5056).

For saving spaces and reducing costs, the loadlock chambers 14a and 14b, the carrying chamber 12, and the process chambers 16a and 16b may be formed of a single aluminum (A5052) component.

At an inner side between the first process unit 36 and the second process unit 38 of one of the process chambers 16, that is, at a side of a boundary wall 48, a second substrate carrying member 40 is installed.

The second substrate carrying member 40 is configured to be rotated on a shaft part 43e which is disposed at the side of the boundary wall 48.

In the other of the process chambers 16, another second substrate carrying member 40 is disposed in contrast to the second substrate carrying member 40 of the process chamber 16 in a state where the boundary wall 48 is located between the second substrate carrying members 40. Owing to this contrasting arrangement, lines for controlling the respective second substrate carrying members 40 can be horizontal laid on the bottom side of the process chambers 16 in a manner that the lines are concentrated at the center of the apparatus, that is, in the vicinity of the boundary wall 48. Therefore, in terms of line spacing, since lines can be installed on each component in a concentrated manner, efficient lines spacing is possible. In addition, since rotation occurs around the shaft part 43e disposed close to the boundary wall 48, the outside of the process chamber 16 can be rounded. Owing to the rounded outside structure, outer parts 11a of an apparatus main body 11 can be chamfered, and thus larger maintenance spaces 17 can be provided for maintenance workers. If the shaft part 43e is disposed outside the process chamber 16, the outer parts 11a may not be chamfered, and thus large maintenance spaces 17 may not be provided for maintenance workers.

One of two non-processed wafers carried by the first substrate carrying member 30 is transferred to the second substrate stage 41 of the second process unit 38 by the second substrate carrying member 40, and a processed wafer disposed on the second substrate stage 41 is transferred to the finger of the first substrate carrying member 30 by the second substrate carrying member 40 (a second substrate carrying mechanism).

Figure 4:
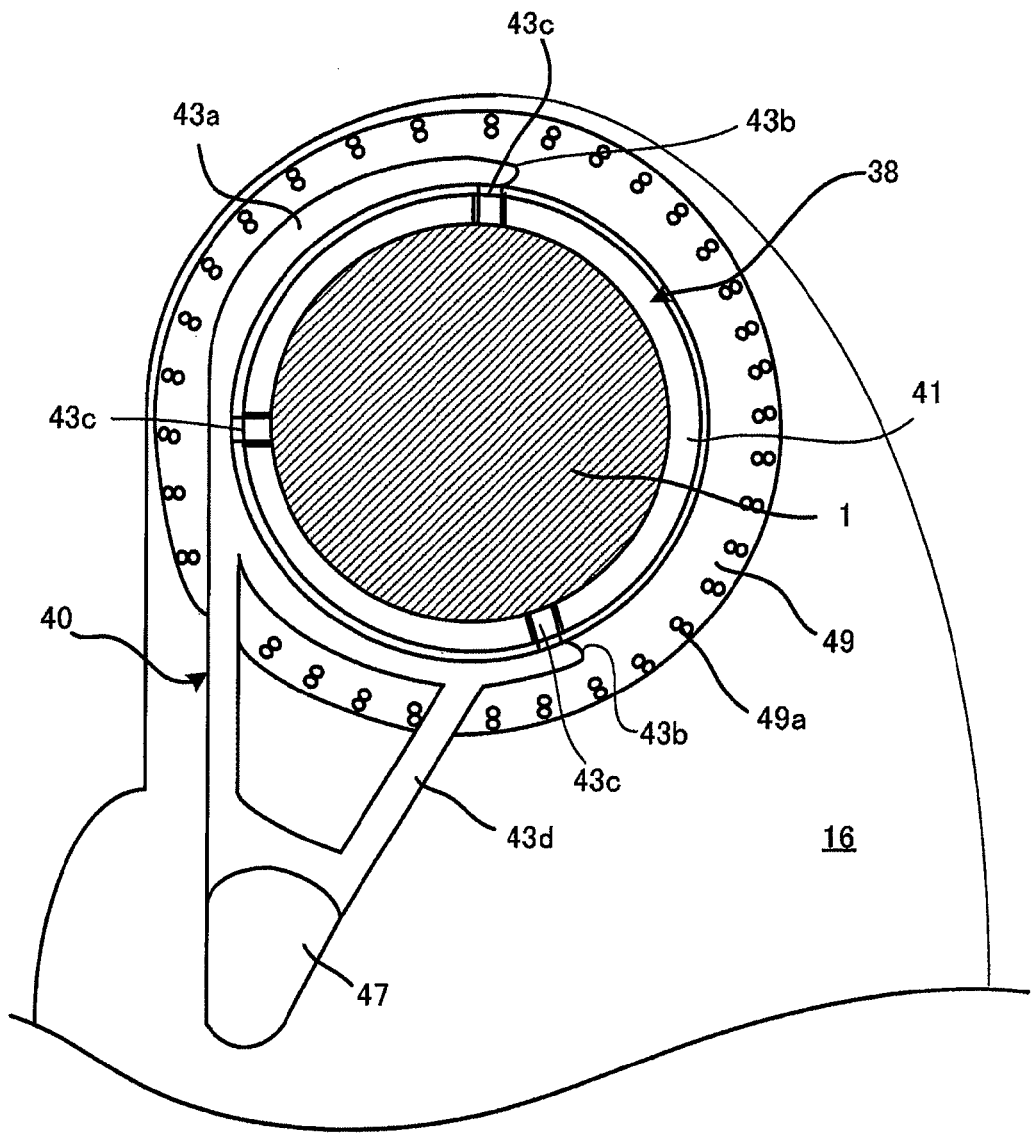
FIG. 4 is a top view illustrating the periphery of a second substrate carrying member when a substrate processing process is performed, according to an embodiment of the present invention.

FIG. 4 is a view illustrating the case where the second substrate carrying member 40 is placed at the second process unit 38 in the process chamber 16 in a standby state (during a substrate processing process).

The second substrate carrying member 40 includes: an arc part 43a larger than the outer diameter of a wafer; notch parts 43b formed by cutting the arc part 43a; claw parts 43c each installed horizontally in a direction from the arc part 43a to the center of the arc part 43a for placing a wafer thereon; and an arm 47 provided with a frame part 43d for supporting the arc part 43a.

The arc part 43a and the frame part 43d are continuously formed and mounted in an approximately horizontal direction the arm 47, so as to support a wafer through the claw parts 43c.

The arm 47 is configured to be rotated on the vertically extended shaft part 43e which is a rotation axis, and the arm 47 is configured to be vertically moved.

When the notch parts 43b is placed at the first process unit 36 by rotation of the shaft part 43e, the notch parts 43b face the gate valve 35 installed between the carrying chamber 12 and the process chamber 16.

Therefore, the second substrate carrying member 40 is configured to be vertically moved when the shaft part 43e is rotated. Owing to this operation, one of two wafers carried to the inside of the process chamber 16 by the first substrate carrying member 30 can be carried from the upper side of the first process unit 36 toward the second process unit 38 and placed on the second process unit 38 which is distant from the carrying chamber 12.

Since the second substrate carrying member 40 is heated to a high temperature (about 250° C.) by heat radiation from the first substrate stage 37 and the second substrate stage 41, it is preferable that the second substrate carrying member 40 be made of a plasma-resistant, heat-resistant material such as alumina ceramics (having a purity of 99.6% or higher), quartz, silicon carbide (SiC), or aluminum nitride (AlN). If the second substrate carrying member 40 is made of a material having a thermal expansion coefficient lower than that of a metal such as alumina ceramics (having a purity of 99.6% or higher), carrying operations can reliably carried out without thermal deformation and deflection. However, a metal component may be used at a base part of the second substrate carrying member 40 so as to adjust the position and level of the second substrate carrying member 40.

The first substrate stage 37 and the second substrate stage 41 are placed in the process chamber 16 and fixed to the apparatus main body 11 by means of fixing members (not shown). In addition, three first substrate holding pins 39a which are substrate holding parts are vertically inserted through the circumference of the first substrate stage 37, and thus a substrate can be vertically moved in an approximately horizontal position by moving the first substrate holding pins 39a vertically. In addition, three second substrate holding pins 39b which are substrate holding parts are vertically inserted through the circumference of the second substrate stage 41, and thus a substrate can be vertically moved in an approximately horizontal position by moving the second substrate holding pins 39b vertically. Thus, a wafer carried through the gate valve 35 by the first substrate carrying member 30 can be placed on the substrate stage by means of the substrate holding pins. That is, by forwardly and reversely rotating a motor under the control of the controller 84, the first substrate holding pins 39a and the second substrate holding pins 39b can be moved upward and downward.

Next, with reference to FIG. 5 through FIG. 12, explanations will be given on process flows for supplying/discharging wafers between the loadlock chamber and the process chamber 16 through the carrying chamber.

In the drawings, the following processes are performed. In addition, the processes shown in FIG. 5 through FIG. 12 are sequential processes.

Figure 5:
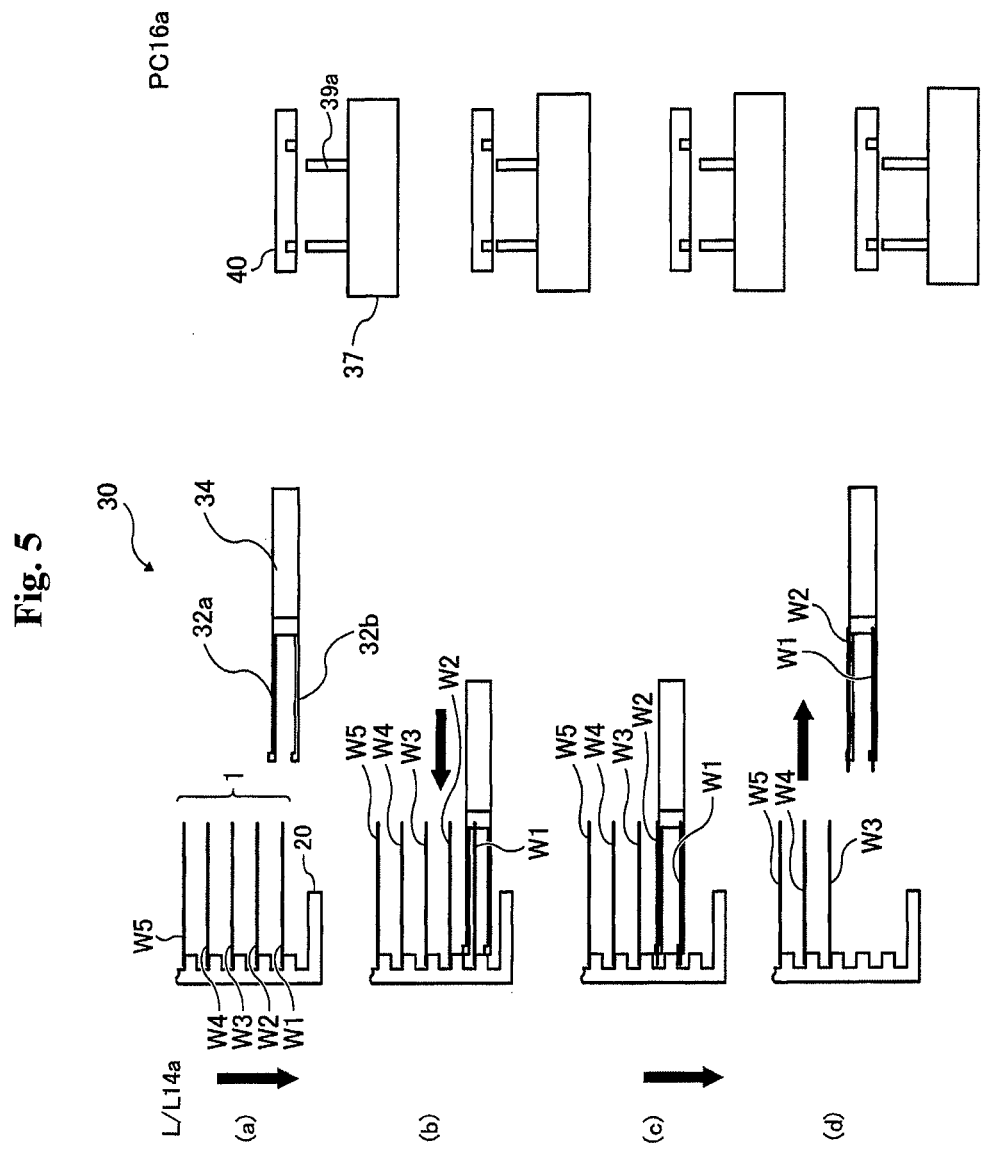
FIG. 5 is a view for explaining a substrate carrying method according to the first embodiment of the present invention.
Figure 6:
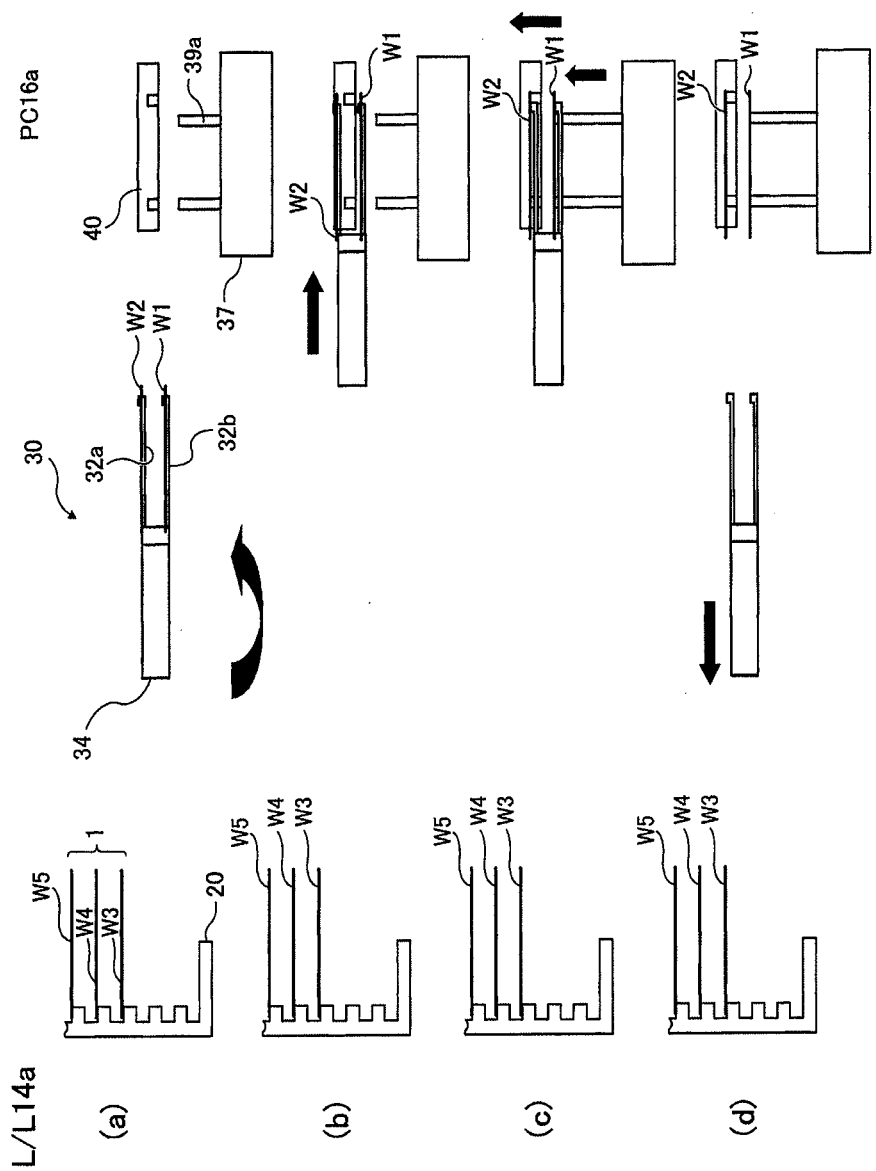
FIG. 6 is a view for explaining a substrate carrying method according to the first embodiment of the present invention.

FIG. 5 and FIG. 6: a process of carrying non-processed wafers from the loadlock chamber 14a to the first process chamber 16a.

Figure 7:
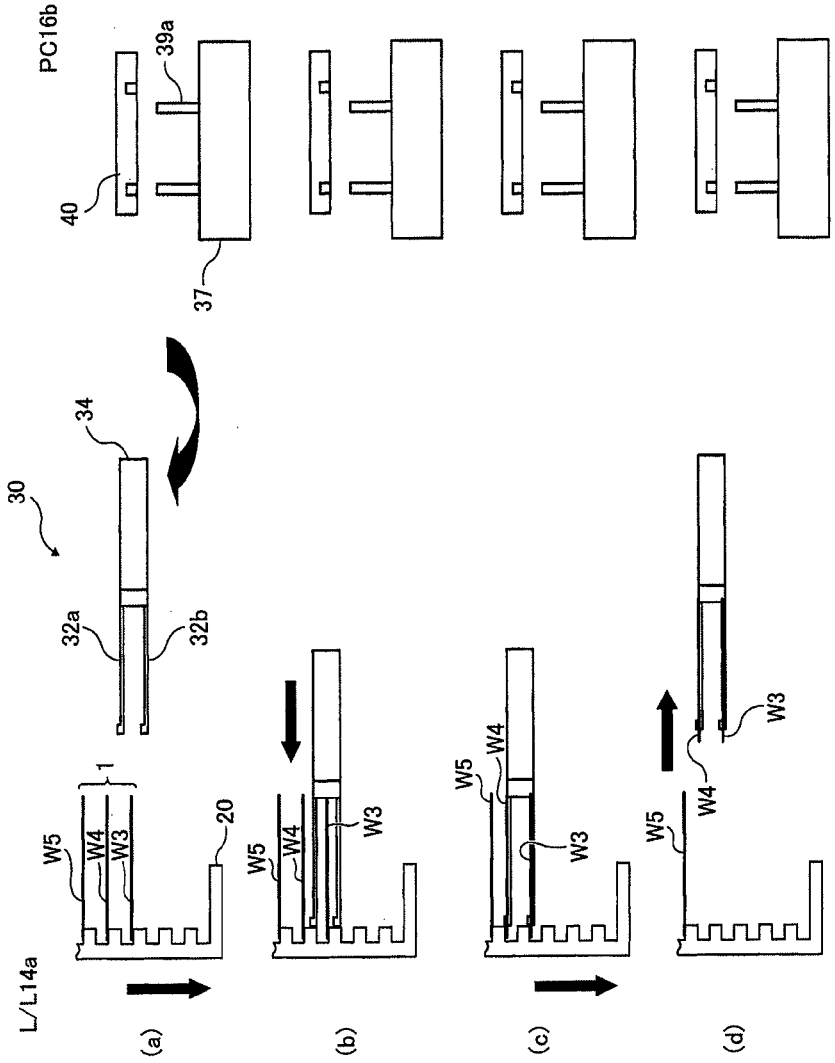
FIG. 7 is a view for explaining a substrate carrying method according to the first embodiment of the present invention.
Figure 8:
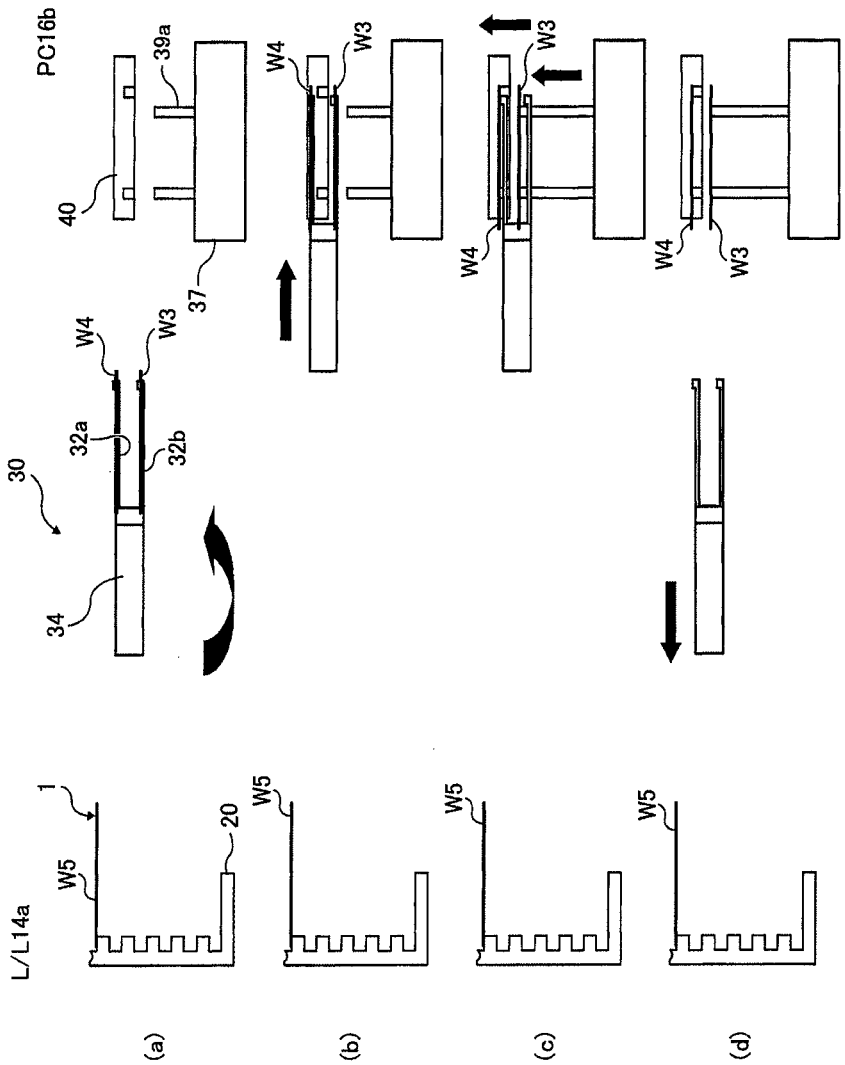
FIG. 8 is a view for explaining a substrate carrying method according to the first embodiment of the present invention.

FIG. 7 and FIG. 8: a process of carrying non-processed wafers from the loadlock chamber 14a to the second process chamber 16b.

Figure 9:
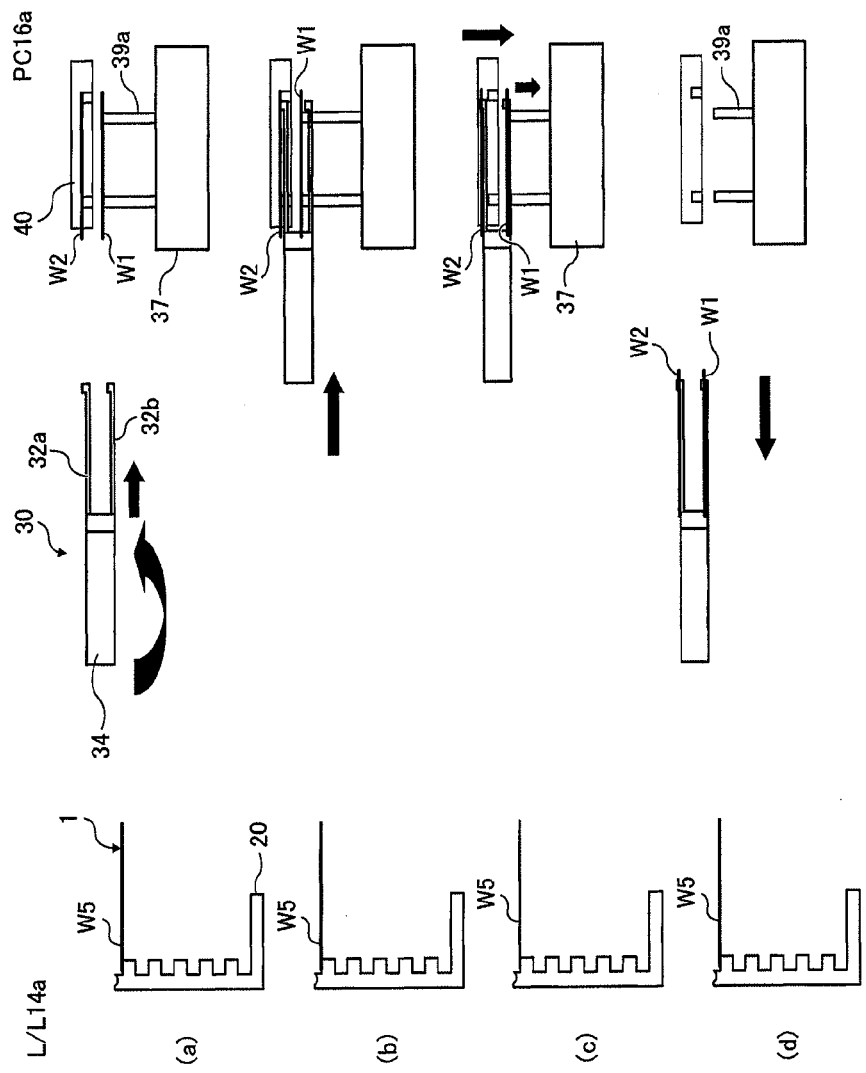
FIG. 9 is a view for explaining a substrate carrying method according to the first embodiment of the present invention.
Figure 10:
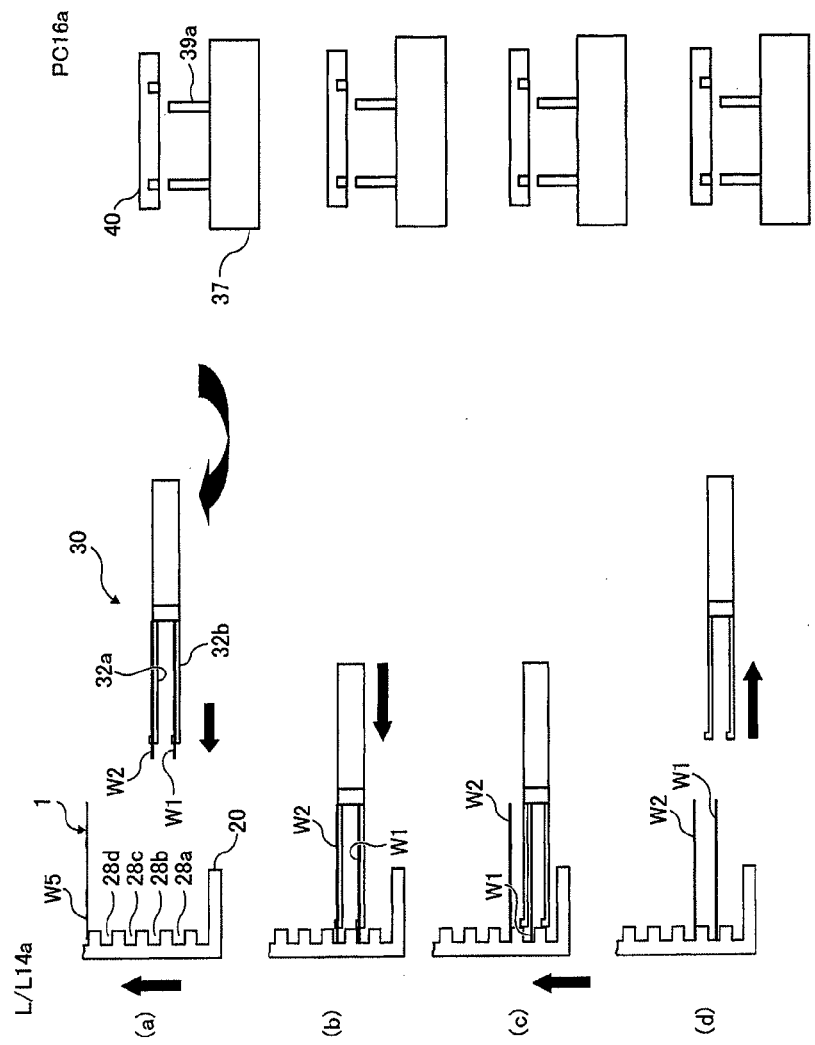
FIG. 10 is a view for explaining a substrate carrying method according to the first embodiment of the present invention.

FIG. 9 and FIG. 10: a process of carrying processed wafers from the first process chamber 16a to the loadlock chamber 14a.

Figure 11:
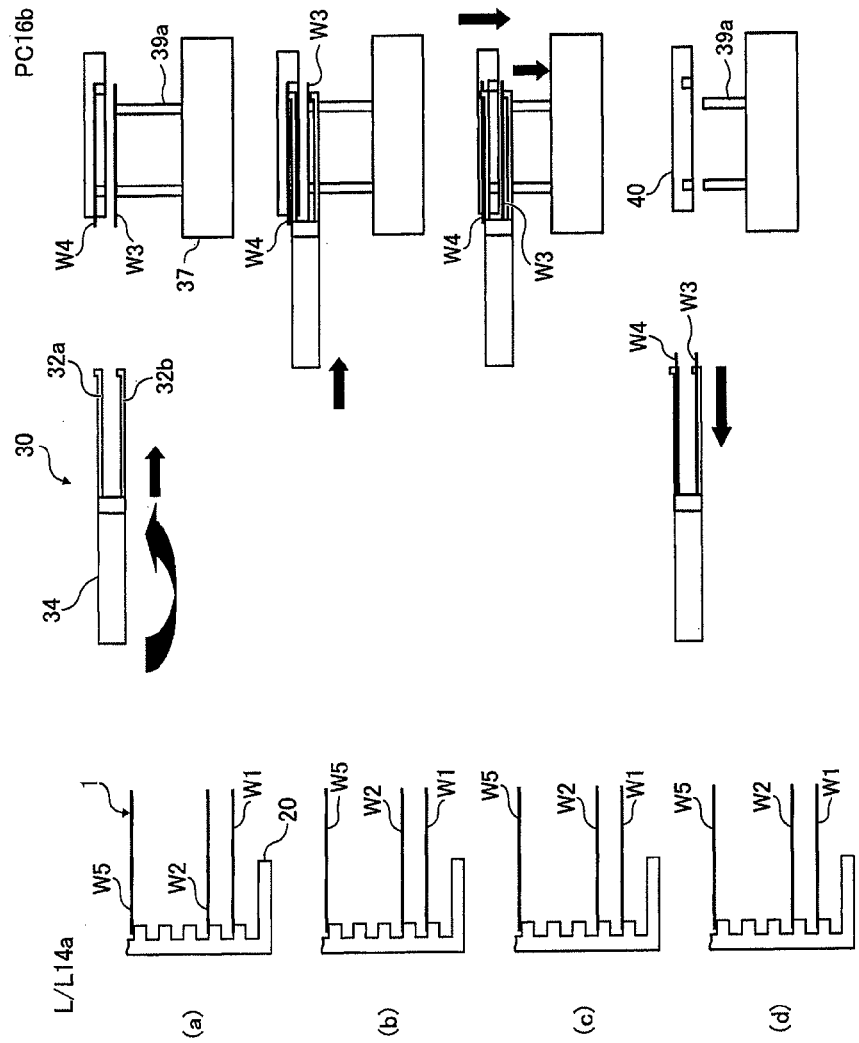
FIG. 11 is a view for explaining a substrate carrying method according to the first embodiment of the present invention.
Figure 12:
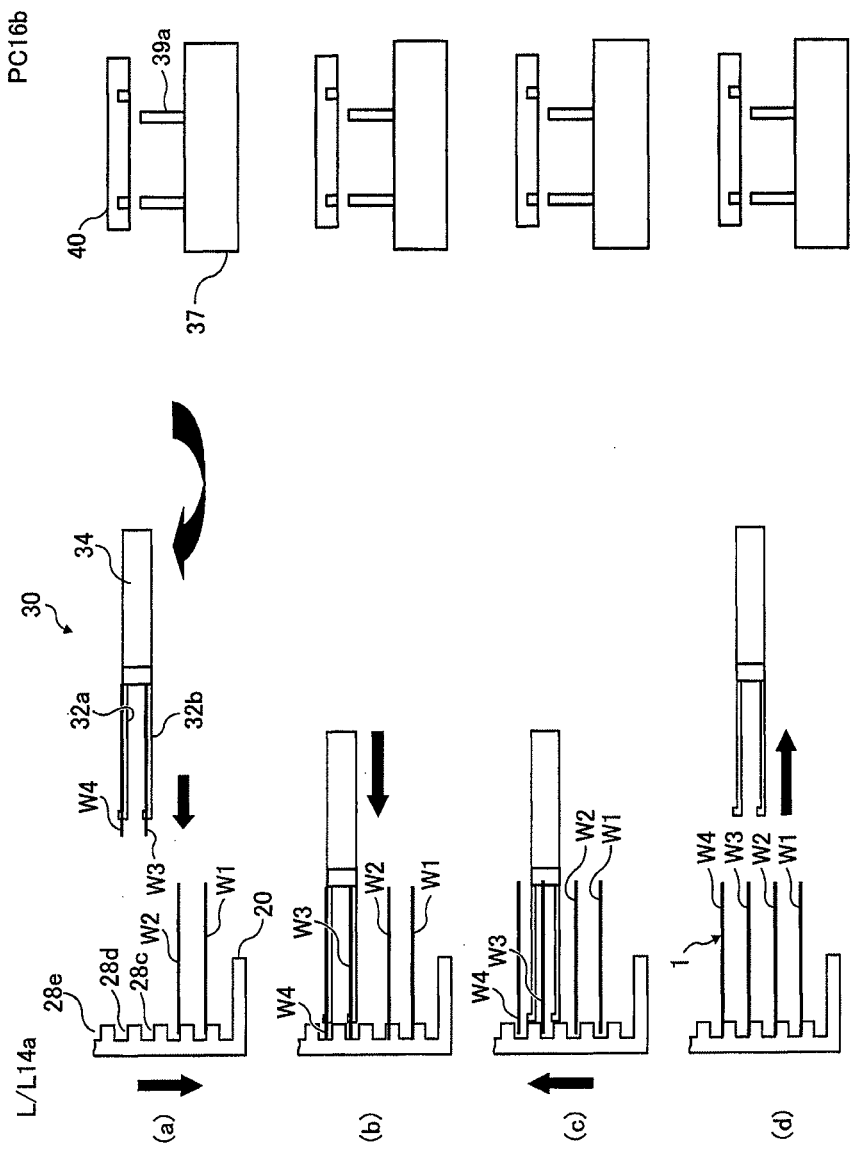
FIG. 12 is a view for explaining a substrate carrying method according to the first embodiment of the present invention.

FIG. 11 and FIG. 12: a process of carrying processed wafers from the second process chamber 16b to the loadlock chamber 14a.

FIG. 5 is a view for explaining an operation of carrying out wafers 1 from the loadlock chamber 14a (L/L14a). FIG. 5 shows a state where wafers 1 are first carried to the process chamber 16 after the wafers 1 are carried from the EFEM 18 to the substrate supporter 20. Therefore, all the wafers 1 loaded on the substrate supporter 20 are non-processed wafers.

<FIG. 5: Step (a)>

First, the vertical position of the substrate supporter 20 is adjusted such that two wafers to be processed can be slightly higher than the upper and lower fingers 32a and 32b of the arm 34 of the first substrate carrying member 30.

That is, it is adjusted such that the vertical position of a first wafer W1 is higher than the vertical position of the lower finger 32b. Further, the vertical positional relationship between a second wafer W2 and the upper finger 32a is adjusted in the same manner.

<FIG. 5: Step (b)>

After the vertical position adjustment, the arm 34 is inserted into the substrate supporter 20. That is, the lower finger 32b is placed just under the wafer W1, and the upper finger 32a is placed just under the wafer W2.

<FIG. 5: Step (c)>

After the arm 34 is inserted, the substrate supporter 20 is moved downward.

By this, wafers are loaded on the respective fingers.

That is, the wafer W1 is loaded on the lower finger 32b, and the wafer W2 is loaded on the upper finger 32a.

<FIG. 5: Step (d)>

After the wafers are loaded on the fingers, the arm 34 is moved toward the process chamber in a state where the orientation of the fingers is not changed. In this way, non-processed wafers are carried out of the substrate supporter 20.

Next, with reference to FIG. 6, an explanation will be given on an operation of carrying the wafers carried out in FIG. 5 into the process chamber 16a (PC16a). The carrying-in operation of FIG. 6 is performed sequentially after the carrying-out operation of FIG. 5.

<FIG. 6: Step (a)>

The arm 34 loaded with the wafers is rotated such that the leading ends of the fingers 32a and 32b are pointed toward the process chamber 16a.

<FIG. 6: Step (b)>

In the process chamber 16a, the first substrate holding pins 39a and the second substrate carrying member 40 are in a standby state.

The arm 34 is horizontally inserted into the process chamber 16a such that the wafers are placed above the first substrate stage 37 of the process chamber 16a and the vertical positions of the respective wafers are located just above the first substrate holding pins 39a and the second substrate carrying member 40.

That is, the wafer W1 loaded on the lower finger 32b is placed just above the first substrate holding pins 39a, and the wafer W2 loaded on the upper finger 32a is placed just above the second substrate carrying member 40.

<FIG. 6: Step (c)>

After the respective wafers are placed above the first substrate stage 37, the first substrate holding pins 39a and the second substrate carrying member 40 are moved upward so as to lift the wafers.

That is, the wafer W1 loaded on the lower finger 32b is loaded on the first substrate holding pins 39a, and the wafer W2 loaded on the upper finger 32a is loaded on the second substrate carrying member 40.

<FIG. 6: Step (d)>

After the wafers are transferred from the respective fingers to the first substrate holding pins 39a and the second substrate carrying member 40, the arm 34 is moved away from the process chamber 16a.

FIG. 7 is a view for explaining an operation of carrying out wafers 1 from the loadlock chamber 14a (L/L14a).

<FIG. 7: Step (a)>

First, the vertical position of the substrate supporter 20 is adjusted such that two wafers to be processed can be slightly higher than the upper and lower fingers 32a and 32b of the arm 34.

That is, it is adjusted such that the vertical position of a third wafer W3 is higher than the vertical position of the lower finger 32b. Further, the vertical positional relationship between a fourth wafer W4 and the upper finger 32a is adjusted in the same manner.

<FIG. 7: Step (b)>

After the vertical position adjustment, the arm 34 is inserted into the substrate supporter 20. That is, the lower finger 32b is placed just under the wafer W3, and the upper finger 32a is placed just under the wafer W4.

<FIG. 7: Step (c)>

After the arm 34 is inserted, the substrate supporter 20 is moved downward.

By this, wafers are loaded on the respective fingers.

That is, the wafer W3 is loaded on the lower finger 32b, and the wafer W4 is loaded on the upper finger 32a.

<FIG. 7: Step (d)>

After the wafers are loaded on the fingers, the arm 34 is moved toward the process chamber in a state where the orientation of the fingers is not changed. In this way, non-processed wafers are carried out of the substrate supporter 20.

Next, with reference to FIG. 8, an explanation will be given on an operation of carrying the wafers carried out in FIG. 7 into the process chamber 16b (PC16b). The carrying-in operation of FIG. 8 is performed sequentially after the carrying-out operation of FIG. 7.

<FIG. 8: Step (a)>

The arm 34 loaded with the wafers is rotated such that the leading ends of the fingers 32a and 32b are pointed toward the process chamber 16b.

<FIG. 8: Step (b)>

In the process chamber 16b, the first substrate holding pins 39a and the second substrate carrying member 40 are in a standby state.

The arm 34 is horizontally inserted into the process chamber 16b such that the wafers are placed above the first substrate stage 37 of the process chamber 16b and the vertical positions of the respective wafers are located just above the first substrate holding pins 39a and the second substrate carrying member 40.

That is, the wafer W3 loaded on the lower finger 32b is placed just above the first substrate holding pins 39a, and the wafer W2 loaded on the upper finger 32a is placed just above the second substrate carrying member 40.

<FIG. 8: Step (c)>

After the respective wafers are placed above the first substrate stage 37, the first substrate holding pins 39a and the second substrate carrying member 40 are moved upward so as to lift the wafers.

That is, the wafer W3 loaded on the lower finger 32b is loaded on the first substrate holding pins 39a, and the wafer W2 loaded on the upper finger 32a is loaded on the second substrate carrying member 40.

<FIG. 8: Step (d)>

After the wafers are transferred from the respective fingers to the first substrate holding pins 39a and the second substrate carrying member 40, the arm 34 is moved away from the process chamber 16b.

Processing operations after the wafers are carried to the process chambers 16a and 16b will be described later.

Next, with reference to FIG. 9, an operation of carrying processed wafers out of the process chamber 16a will be described.

<FIG. 9: Step (a)>

When substrates are carried out, the wafer W1 processed at the first process unit 36 of the process chamber 16a is loaded on the first substrate holding pins 39a. In addition, the wafer W2 processed at the second process unit 38 is loaded on the second substrate carrying member 40. The wafers are held above the first substrate stage 37.

Meanwhile, the arm 34 moved away from the process chamber 16b is rotated such that the leading ends of the fingers are pointed toward the process chamber 16a.

In addition, the vertical positions at this time are as follows: the wafer loaded on the second substrate carrying member 40 is higher than the upper finger 32a, and the wafer loaded on the first substrate holding pins 39a is higher than the lower finger 32b.

<FIG. 9: Step (b)>

The arm 34 is inserted into the process chamber 16a.

At this time, the upper finger 32a is placed just under the wafer loaded on the second substrate carrying member 40, and the lower finger 32b is placed just under the wafer loaded on the first substrate holding pins 39a.

<FIG. 9: Step (c)>

The second substrate carrying member 40 and the first substrate holding pins 39a are moved downward. By this, the wafers can be loaded on the fingers.

That is, the wafer loaded on the second substrate carrying member 40 is transferred to the upper finger 32a, and the wafer loaded on the first substrate holding pins 39a is transferred to the lower finger 32b.

<FIG. 9: Step (d)>

After the wafers are transferred to the fingers, the arm 34 is moved away from the process chamber 16a.

Next, with reference to FIG. 10, an explanation will be given on an operation of carrying the processed wafers, which are carried out of the process chamber 16a, to the loadlock chamber 14a and placing the processed wafers on the substrate supporter 20.

<Fig. 10: step (a)>

The arm 34 moved away from the process chamber 16a is rotated such that the leading ends of the fingers are pointed toward the loadlock chamber 14a.

In addition, at this time, the position of the substrate supporter 20 is changed as follows.

That is, so as to load the processed wafers on the original resting parts 28 (where the wafers are originally placed when the wafers are loaded from the EFEM 18 to the substrate supporter before being processed), the original resting parts are set to be lower than the vertical positions of the wafers, respectively, but the vertical positions of the wafers are lower than the next upper original resting parts, respectively.

In detail, the position of the substrate supporter 20 is adjusted such that the position of a resting part 28a for the processed wafer W1 is set to be lower than the processed wafer W1 but the processed wafer W1 is lower than a resting part 28b that is located just above the resting part 28a.

Since the substrate supporter 20 is moved downward in the previous operation (the operation of carrying out the wafers W3 and W4 as shown in FIG. 7), when the wafers W1 and W2 are carried back to the substrate supporter 20, the substrate supporter 20 is moved upward so as to place the substrate supporter 20 at the above-described set position.

Although the example of carrying the wafers W1 and W2 has been only described, other wafers are carried by setting positions in the same way as described above.

<Fig. 10: step (b)>

After the position of the substrate supporter 20 is set, the arm 34 is inserted in the direction of the substrate supporter 20.

That is, the wafer W1 loaded on the lower finger 32b is held between the topside of the resting part 28a and the bottom side of the resting part 28b, and the wafer W2 loaded on the upper finger 32a is held between the topside of the resting part 28b and the bottom side of a resting part 28c.

<Fig. 10: step (c)>

After the arm 34 is inserted, the substrate supporter 20 is moved upward. By this, the respective resting parts push the wafers upward, and thus the wafers are transferred to the resting parts.

<FIG. 10: Step (d)>

After the wafers are transferred from the fingers to the substrate supporter 20, the arm 34 is moved away from the load lock chamber 14a.

Next, with reference to FIG. 11, an operation of carrying processed wafers out of the process chamber 16b will be described.

<FIG. 11: Step (a)>

When substrates are carried out, the wafer W3 processed at the first process unit 36 of the process chamber 16b is loaded on the first substrate holding pins 39a. In addition, the wafer W4 processed at the second process unit 38 is loaded on the second substrate carrying member 40. The wafers are held above the first substrate stage 37.

Meanwhile, the arm 34 moved away from the loadlock chamber 14a is rotated such that the leading ends of the fingers are pointed toward the process chamber 16b.

In addition, the vertical positions at this time are as follows: the wafer loaded on the second substrate carrying member 40 is higher than the upper finger 32a, and the wafer loaded on the first substrate holding pins 39a is higher than the lower finger 32b.

<FIG. 11: Step (b)>

The arm 34 is inserted into the process chamber 16b.

At this time, the upper finger 32a is placed just under the wafer loaded on the second substrate carrying member 40, and the lower finger 32b is placed just under the wafer loaded on the first substrate holding pins 39a.

<FIG. 11: Step (c)>

The second substrate carrying member 40 and the first substrate holding pins 39a are moved downward. By this, the wafers can be loaded on the fingers.

That is, the wafer loaded on the second substrate carrying member 40 is transferred to the upper finger 32a, and the wafer loaded on the first substrate holding pins 39a is transferred to the lower finger 32b.

<FIG. 11: Step (d)>

After the wafers are transferred to the fingers, the arm 34 is moved away from the process chamber 16b.

Next, with reference to FIG. 12, an explanation will be given on an operation of carrying the processed wafers, which are carried out of the process chamber 16b, to the loadlock chamber 14a and placing the processed wafers on the substrate supporter 20.

<Fig. 12: step (a)>

The arm 34 moved away from the process chamber 16b is rotated such that the leading ends of the fingers are pointed toward the loadlock chamber 14a.

In addition, at this time, the position of the substrate supporter 20 is changed as follows.

That is, so as to load the processed wafers on the original resting parts 28 (where the wafers are originally placed when the wafers are loaded from the EFEM 18 to the substrate supporter before being processed), the original resting parts are set to be lower than the vertical positions of the wafers, respectively, but the vertical positions of the wafers are lower than the next upper original resting parts, respectively.

In detail, the position of the substrate supporter 20 is adjusted such that the position of the resting part 28c for the processed wafer W3 is set to be lower than the processed wafer W3 but the processed wafer W3 is lower than a resting part 28d that is located just above the resting part 28c.

Since the substrate supporter 20 is moved upward in the previous operation (the operation of carrying in the wafers W1 and W2 shown in FIG. 10), when the wafers W3 and W4 are carried back to the substrate supporter 20, the substrate supporter 20 is moved upward so as to place the substrate supporter 20 at the above-described set position.

Although the example of carrying the wafers W3 and W4 has been only described, other wafers are carried by setting positions in the same way as described above.

<Fig. 12: step (b)>

After the position of the substrate supporter 20 is set, the arm 34 is inserted into the substrate supporter 20.

That is, the wafer W3 loaded on the lower finger 32b is held between the topside of the resting part 28c and the bottom side of the resting part 28d, and the wafer W4 loaded on the upper finger 32a is held between the topside of the resting part 28d and the bottom side of a resting part 28e.

<Fig. 12: step (c)>

After the position of each element is set, the substrate supporter 20 is moved upward. By this, the respective resting parts push the wafers upward, and thus the wafers are transferred to the resting parts.

<FIG. 12: Step (d)>

After the wafers are transferred from the fingers to the substrate supporter, the arm 34 is moved away from the load lock chamber 14a.

After the operation of FIG. 12, the next non-processed wafers are carried as shown in FIG. 8 so as to supply the non-processed wafers to the process chamber 16a from which processed wafers are just carried away as shown in FIG. 7.

In this way, the substrate supporter 20, the first substrate carrying member 30 (the arm 34), the second substrate carrying member 40, and the substrate holding pins 39 are cooperatively operated, and by repeating this cooperative operation, wafers are carried.

In the current embodiment, although use of the loadlock chamber 14a is only explained, the present invention is not limited thereto; that is, the other loadlock chamber 14b may be used in the same way for processing wafers.

Next, a transfer flow of wafers supplied to the inside of the process chamber 16 will be described with reference to FIG. 13 and FIG. 14.

Figure 13:
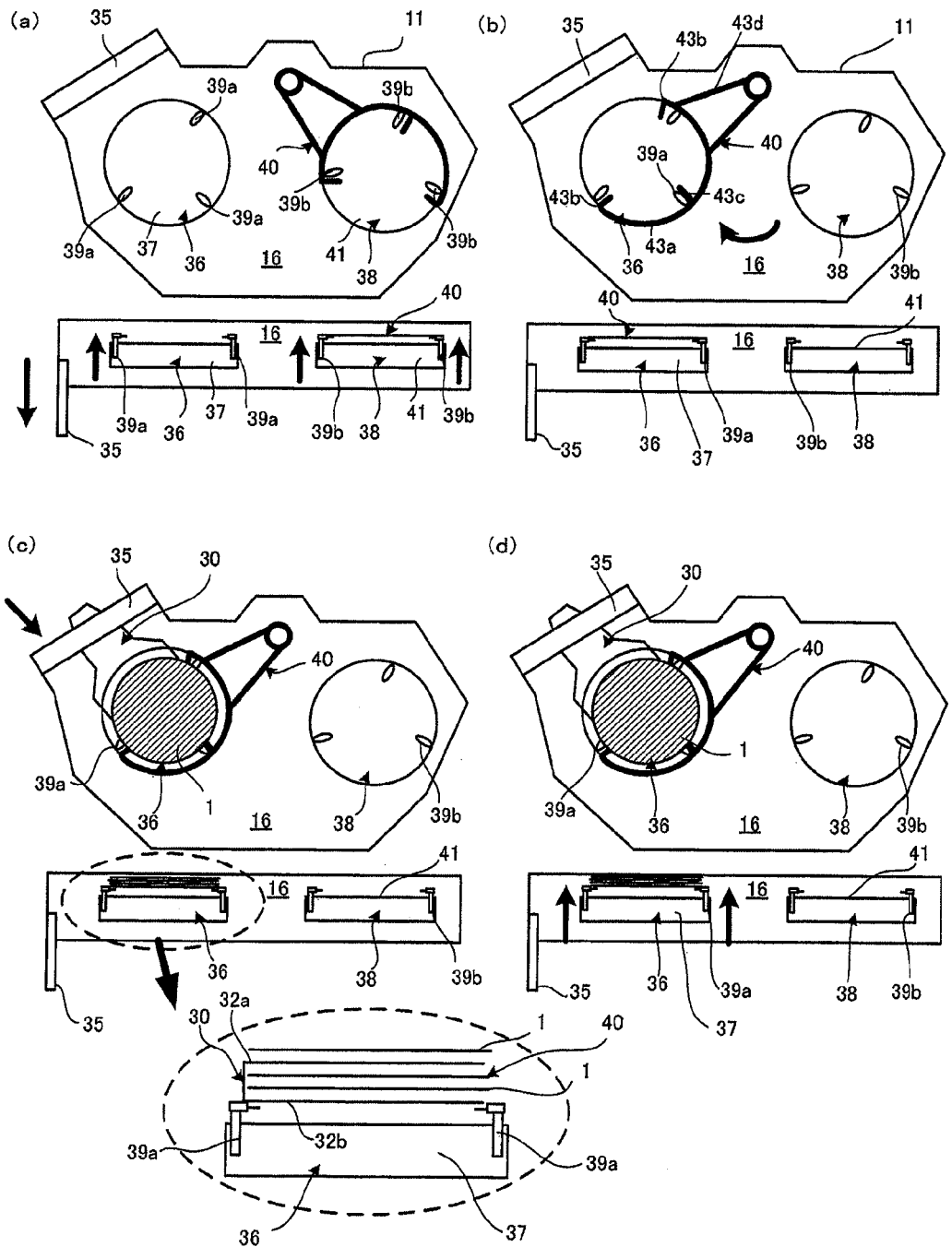
FIG. 13 is a top view illustrating the inside of the process chamber for explaining a wafer transfer flow according to an embodiment of the present invention.
Figure 14:
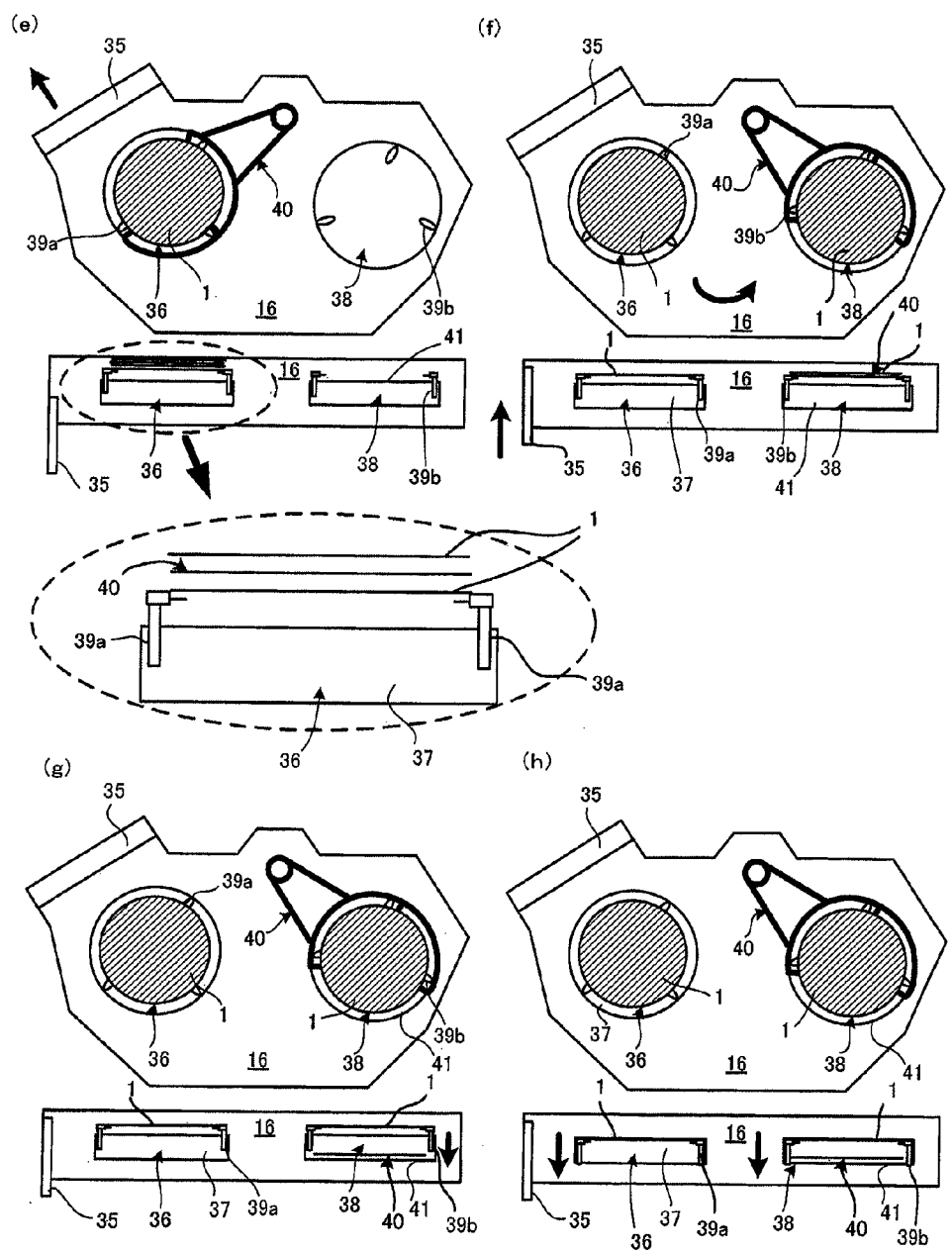
FIG. 14 is a top view illustrating the inside of the process chamber for explaining the next procedure of the wafer transfer flow after the procedure illustrated in FIG. 13, according to an embodiment of the present invention.

In section (a) to section (d) of FIG. 13 and section (e) to section (h) of FIG. 14, upper drawings are top views of the process chamber 16, and lower drawings are sectional views of the process chamber 16 provided for the illustrative purpose.

In the lower drawings, one of the first substrate holding pins 39a is installed in the first process unit 36 at a position close to the gate valve 35. However, this is for illustrative purpose. Actually, as shown in the upper drawings, any of the first substrate holding pins 39a is not installed at an inside region of the first process unit 36 close to the gate valve 35, that is, at a region where the first substrate carrying member 30 is placed in a standby state as shown in section (c) of FIG. 13.

First, the inside of the process chamber 16 is vacuum-evacuated to the same pressure as the inside pressure of the carrying chamber 12. In the following description, each part of the substrate processing apparatus 10 is controlled by the controller 84.

<Step 1: FIG. 13(a)>

The gate valve 35 is opened, and the first substrate holding pins 39a of the first process unit 36 and the second substrate holding pins 39b of the second process unit 38 are moved upward. The second substrate carrying member 40 is placed at the second process unit 38 in a standby state and is moved upward together with the first substrate holding pins 39a and the second substrate holding pins 39b.

<Step 2: FIG. 13(b)>

The second substrate carrying member 40 is moved approximately horizontally toward the first process unit 36 as the shaft part 43e is rotated. At this time, the notch parts 43b of the second substrate carrying member 40 are positioned to face the gate valve 35.

<Step 3: FIG. 13(c)>

While the first substrate carrying member 30 carries both two wafers loaded on the upper and lower fingers 32a and 32b, the first substrate carrying member 30 is moved from the carrying chamber 12 to the process chamber 16 through the gate valve 35, and then the first substrate carrying member 30 is stopped at a position above the first process unit 36. At this time, the second substrate carrying member 40 is properly placed at a standby position so that the second substrate carrying member 40 can be inserted between the finger pair 32, that is, between the upper and lower fingers 32a and 32b.

<Step 4: FIG. 13(d)>

In state where the first substrate carrying member 30 is stopped, the first substrate holding pins 39a of the first process unit 36 are moved upward so that the wafer loaded on the lower finger 32b can be placed on the first substrate holding pins 39a. In addition, the second substrate carrying member 40 is moved upward so that the wafer loaded on the upper finger 32a can be placed on the claw parts 43c of the second substrate carrying member 40.

<Step 5: FIG. 14(e)>

The first substrate carrying member 30 is returned to the carrying chamber 12.

<Step 6: FIG. 14(f)>

In a state where the wafer 1 is placed on the second substrate carrying member 40, the second substrate carrying member 40 is moved approximately horizontally toward the second process unit 38 as the shaft part 43e is rotated.

The gate valve 35 is closed.

<Step 7: FIG. 14(g)>

The shaft part 43e is moved downward such that the second substrate carrying member 40 is moved to a lower side of the circumference of the second process unit 38.

Since the second substrate carrying member 40 is placed in the process chamber 16 during a wafer processing process, the second substrate carrying member 40 may hinder a flow of process gas (for example, $O_2$ radicals) supplied from an upper side of the second process unit 38 and deteriorate wafer in-surface uniformity. Therefore, the second substrate carrying member 40 is moved to a circumferential position of the second process unit 38 so as to place the second substrate carrying member 40 at a proper height not to hinder a gas flow.

<Step 8: FIG. 14(h)>

The first substrate holding pins 39a of the first process unit 36, and the second substrate holding pins 39b of the second process unit 38 are lowered almost at the same time in a state where the wafers 1 are held approximately horizontally, so as to place the wafers 1 on the first substrate stage 37 and the second substrate stage 41, respectively. That is, the wafers are lowered in a manner that the distances between the wafers and the corresponding substrate stages can be equal.

The reason for this is to keep thermal effects of the first and second process units 36 and 38 on the wafers at the same level. By this equalization of thermal effects, for example, the wafers can be processed with a uniform ashing rate. In the case of processing substrates by chemical vapor deposition (CVD), films having substantially the same thickness can be formed.

In addition, if completely the same thermal effect condition is not necessary but a uniform ashing rate or film thickness is only necessary, an inconsiderable error may be allowed. For example, an error of 2 seconds may be allowed.

Instead of lowering the first and second substrate holding pins 39a and 39b almost at the same time so as to result in the same thermal effect, the heaters may be individually controlled.

Furthermore, the substrate holding pins 39 are lowered in the apparatus; however, instead of that, the substrate stages may be moved upward and downward.

Thereafter, gas is supplied to the inside of the process chamber 16 to generate plasma (for an ashing process), and after wafers are processed, the wafers are carried out in the reverse sequence.

Next, a second embodiment will be described with reference to FIG. 15 through Fig. 31.

The difference with the first embodiment is a first substrate carrying member. In the first embodiment, the first substrate carrying member 30 includes a single arm 34; however, in the second embodiment, a first substrate carrying member 70 includes two arms 74 and 75. Each of the arms 74 and 75 has two fingers.

Hereinafter, the second embodiment will be described in detail.

Elements denoted by the same reference numerals as those used in the first embodiment have the same functions or structures, and thus, descriptions thereof will not be repeated.

Figure 15:
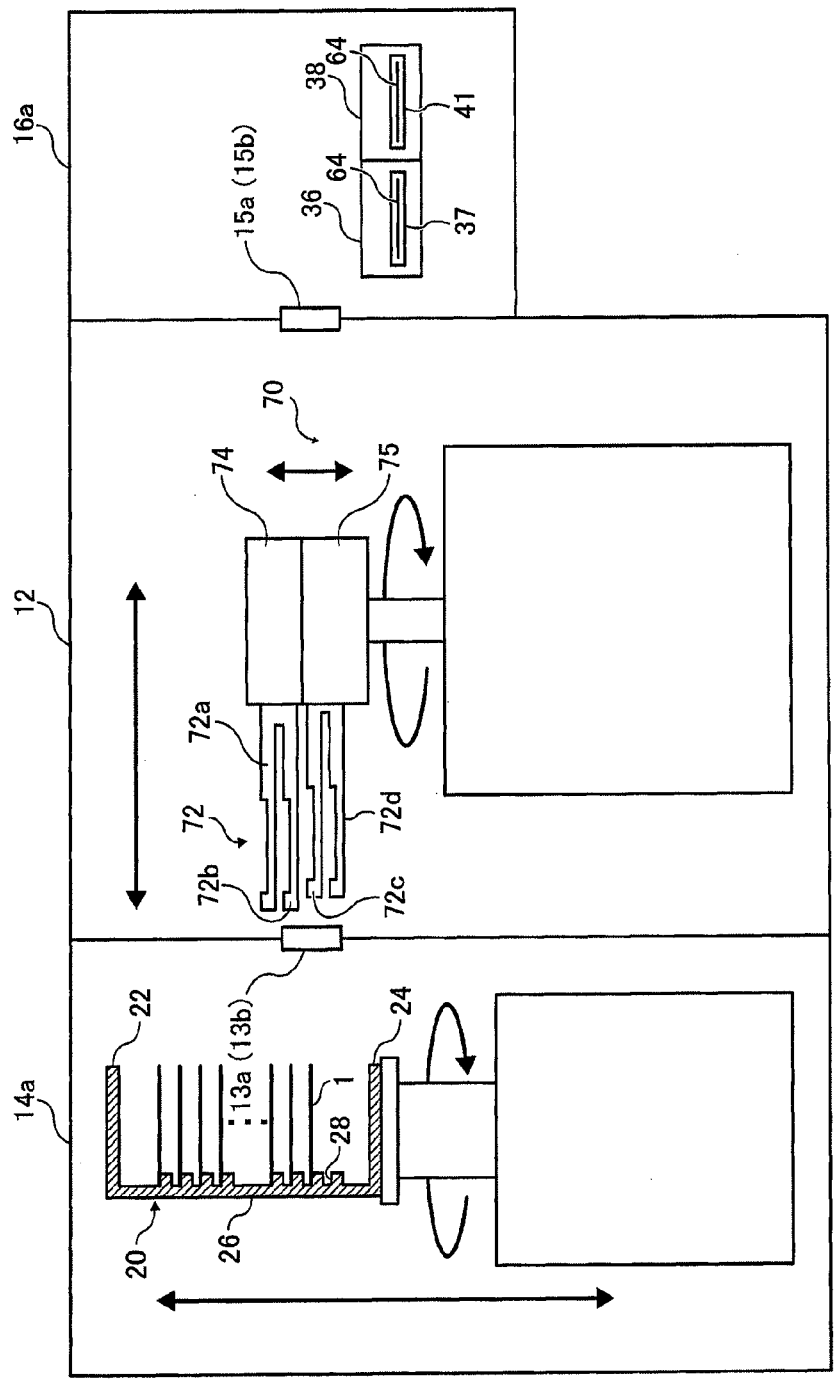
FIG. 15 is a vertical sectional view illustrating the entire structure of a substrate processing apparatus according to a second embodiment of the present invention.

FIG. 15 illustrates a substrate processing apparatus according to the second embodiment.

As shown in FIG. 15, in a loadlock chamber 14a (14b), a substrate supporter (boat) 20 is installed, which is capable of accommodating substrates, for example, twenty five substrates, in a manner that the substrates are vertically arranged at regular intervals. Inside of the loadlock chamber 14a (14b), the substrate supporter 20 is configured to be moved vertically (upwardly and downwardly) and rotated on a vertically-extendable rotation shaft.

At a carrying chamber 12, a first substrate carrying member 70 is installed as a substrate carrying unit configured to carry wafers 1 between the loadlock chamber 14a (14b) and a process chamber 16a (16b). The first substrate carrying member 70 includes an upper arm 74 having upper and lower fingers 72a and 72b, and a lower arm 75 having upper and lower fingers 72c and 72d. The upper finger 72a and the lower finger 72b are spaced a predetermined distanced from each other in a vertical direction and is extended approximately horizontally from the upper arm 74 in the same direction, so that the upper finger 72a and the lower finger 72b can support wafers 1, respectively.

Similarly, the upper finger 72c and the lower finger 72d are spaced a predetermined distanced from each other in a vertical direction and is extended approximately horizontally from the lower arm 75 in the same direction, so that the upper finger 72c and the lower finger 72d can support wafers 1, respectively.

The upper arm 74 and the lower arm 75 are piled up and are capable of moving horizontally independent of each other. The upper arm 74 and the lower arm 75 are configured to be rotated on a vertically extendable rotation shaft and moved horizontally. In addition, the upper arm 74 and the lower arm 75 can be vertically moved.

In a wafer carrying operation, two wafers are loaded on one of the upper arm 74 and the lower arm 75 and are carried.

Between the carrying chamber 12 and the loadlock chamber 14a, a first substrate pass port 13a is installed, and between the carrying chamber 12 and the loadlock chamber 14b, a second substrate pass port 13b is installed. In addition, between the carrying chamber 12 and the process chamber 16a, a third substrate pass port 15a is installed, and between the carrying chamber 12 and the process chamber 16b, a fourth substrate pass port 15b is installed. Gate valves 35 are installed at the substrate pass ports, respectively. The loadlock chambers, the carrying chamber, and the process chambers communicate with one another through the substrate pass ports. The substrate pass ports are fixed to the apparatus.

Therefore, non-processed wafers stocked in the loadlock chambers 14a and 14b can be transferred to the process chambers 16a and 16b through the gate valves 35, two at a time, by using the first substrate carrying member 70 disposed at the carrying chamber 12, and processed wafers can be transferred from the process chambers 16a and 16b to the loadlock chambers 14a and 14b, two at a time, by using the first substrate carrying member 70.

FIG. 16 illustrates the fingers of the upper arm 74.

Section (a) of FIG. 16 illustrates the upper finger 72a of the upper arm 74. The upper finger 72a will be referred to as a first finger 72a.

The first finger 72a is supported by and fixed to the arm through a supporting part 80. A wafer resting part 82 is grooved for placing a wafer thereon. A penetration hole 85 is formed through the first finger 72a as a first penetration hole 85, and penetration holes 86 are formed through the first finger 72a as second penetration holes 86 so that light cast from a reflective displacement sensor (described later) can pass therethrough. The penetration holes are set such that when a wafer is placed on the wafer resting part 82, parts of the penetration holes located at a side of the wafer resting part 82 can be overlapped with the wafer.

The first penetration hole 85 is set such that when a wafer is placed on the wafer resting part 82, a resting part side 85a of the first penetration hole 85 located at a side of the wafer resting part 82 can be overlapped with the wafer. In addition, it is set such that a supporting part side 85b of the first penetration hole 85 located at a side of the supporting part is not overlapped with the wafer.

Similarly, each of the second penetration holes 86 is set such that when a wafer is placed on the wafer resting part 82, a resting part side 86a of the second penetration hole 86 located at a side of the wafer resting part 82 can be overlapped with the wafer. In addition, it is set such that a supporting part side 86b of the second penetration hole 86 located at a side of the supporting part is not overlapped with the wafer.

Section (b) of FIG. 16 illustrates the lower finger 72b of the upper arm 74. The lower finger 72b will be referred to as a second finger 72b.

The second finger 72b is supported by and fixed to the arm through a supporting part 80. Notches 90 are formed on the leading ends of a wafer resting part 88 such that when light is cast from a lower reflective displacement sensor to the bottom side of the second finger 72b, the light can pass through the notches 90. When a wafer is placed on the wafer resting part 88, the wafer is placed over the notches 90. When the first finger 72a and the second finger 72b are overlapped, the notches 90 are overlapped with the first finger 72a. Owing to this structure, when a wafer is not placed, light cast from the reflective displacement sensor passes through the notches 90 and is reflected by the bottom surface of the first finger 72a. By detecting the reflected light, the distance from the reflective displacement sensor to the first finger 72a can be measured. If the distance to the first finger 72a is measured, it is determined that a wafer is not placed on the second finger 72b. If the distance to the second finger 72b is measured, it is determined that a wafer is placed on the second finger 72b.

A penetration hole 92 is formed through the second finger 72b so that light cast from an upper reflective displacement sensor can pass through the penetration hole 92. The penetration hole 92 is set such that when a wafer is placed on the wafer resting part 88, a resting part side 92a of the penetration hole 92 located at a side of the wafer resting part 88 can be overlapped with the wafer. In addition, it is set such that a supporting part side 92b of the penetration hole 92 located at a side of the supporting part is not overlapped with the wafer.

Figure 17:
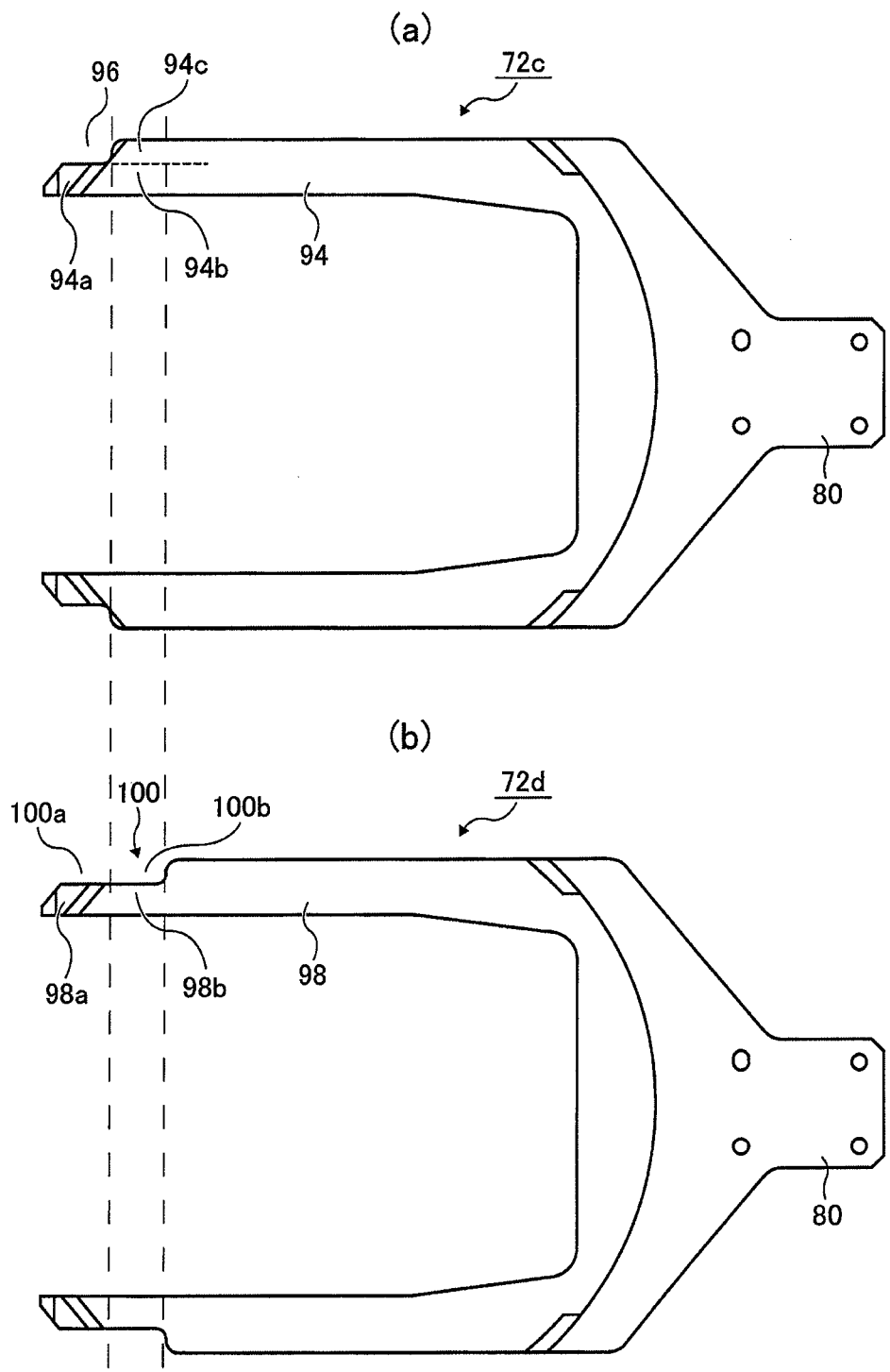
FIG. 17 is a top view illustrating a lower arm of the first substrate carrying member according to the second embodiment of the present invention.

FIG. 17 illustrates the fingers of the lower arm 75.

Section (a) of FIG. 17 illustrates the upper finger 72c of the lower arm 75. The upper finger 72c will be referred to as a third finger 72c.

The third finger 72c is supported by and fixed to the arm through a supporting part 80. A wafer resting part 94 is grooved for placing a wafer thereon. Each of the leading ends of the wafer resting part 94 is constituted by a first leading end part 94a, a second leading end part 94b, and third leading end part 94c. The first leading end part 94a is most distant from the supporting part 80. The second leading end part 94b neighbors the first leading end part 94a and is located at an inner side of the wafer resting part 94. The third leading end part 94c neighbors the second leading end part 94b and is located at an outer side of the wafer resting part 94. In addition, a notch 96 is formed in an outside region of the wafer resting part 94 that adjoin both the first leading end part 94a and the third leading end part 94c.

Section (b) of FIG. 17 illustrates the lower finger 72d of the lower arm 75. The lower finger 72d will be referred to as a fourth finger 72d.

The fourth finger 72d is supported by and fixed to the arm through a supporting part 80. A wafer resting part 98 is grooved for placing a wafer thereon. Each of the leading ends of the wafer resting part 98 is constituted by a first leading end part 98a and a second leading end part 98b. The first leading end part 98a is most distant from the supporting part 80. The second leading end part 98b neighbors the first leading end part 98a and is closest to the supporting part 80. In addition, a notch 100 is formed in an outside region of the wafer resting part 98 that adjoin both the first leading end part 98a and the second leading end part 98b. The notch 100 includes a first notch 100a adjoining the first leading end part 98a, and a second notch 100b adjoining the second leading end part 98b.

The notch 100 is formed so as to transmit light cast from a reflective displacement sensor or light of the reflective displacement sensor reflected by the third finger 72c. In addition, the notch 100b is set to be overlapped with the third leading end part 94c of the third finger 72c.

Next, with reference to Fig. 18, a wafer detecting unit of the present invention Will be described.

Section (a) of FIG. 18 is a bottom view of the substrate processing apparatus 10, and section (b) of FIG. 18 is a top view of the substrate processing apparatus 10.

At the bottom side of the carrying chamber 12, reflective displacement sensors 102a and 102b, transmissive sensor light receiving units 104a and 104b, reflective displacement sensors 106a and 106b, and transmissive sensor light receiving units 108a and 108b are installed.

In addition, at the topside of the carrying chamber 12, transmissive sensor light projecting units 110a and 110b, reflective displacement sensors 112a and 112b, reflective displacement sensors 114a and 114b, and transmissive sensor light projecting units 116a and 116b are installed.

The reflective displacement sensor 102a is used to detect a wafer to determine whether a wafer is placed on the second finger 72b of the upper arm 74 when wafers are carried into and out of the loadlock chamber 14a. Similarly, the reflective displacement sensor 102b is used to detect a wafer to determine whether a wafer is placed on the second finger 72b of the upper arm 74 when wafers are carried into and out of the loadlock chamber 14b.

The transmissive sensor light receiving unit 104a and the transmissive sensor light projecting unit 110a are paired in a manner that light cast from the transmissive sensor light projecting unit 110a is received by the transmissive sensor light receiving unit 104a.

By using the transmissive sensor light receiving unit 104a and the transmissive sensor light projecting unit 110a, it can be determined whether a wafer is placed on the lower arm 75 when wafers are carried into and out of the loadlock chamber 14a.

In addition, similarly, the transmissive sensor light receiving unit 104b and the transmissive sensor light projecting unit 110b are used to determine whether a wafer is placed on the lower arm 75 when wafers are carried into and out of the loadlock chamber 14b.

The reflective displacement sensor 106a is used to detect a wafer to determine whether a wafer is placed on the fourth finger 72d of the lower arm 75 when wafers are carried into and out of the process chamber 16a. Similarly, the reflective displacement sensor 106b is used to detect a wafer to determine whether a wafer is placed on the fourth finger 72d of the lower arm 75 when wafers are carried into and out of the process chamber 16b.

The transmissive sensor light receiving unit 108a and the transmissive sensor light projecting unit 116a are paired in a manner that light cast from the transmissive sensor light projecting unit 116a is received by the transmissive sensor light receiving unit 108a.

By using the transmissive sensor light receiving unit 108a and the transmissive sensor light projecting unit 116a, it can be determined whether a wafer is placed on the lower arm 75 when wafers are carried into and out of the process chamber 16a.

In addition, similarly, the transmissive sensor light receiving unit 108b and the transmissive sensor light projecting unit 116b are used to determine whether a wafer is placed on the lower arm 75 when wafers are carried into and out of the process chamber 16b.

The reflective displacement sensor 112a is used to detect a wafer to determine whether a wafer is placed on the first finger 72a of the upper arm 74 when wafers are carried into and out of the loadlock chamber 14a. Similarly, the reflective displacement sensor 112b is used to detect a wafer to determine whether a wafer is placed on the first finger 72a of the upper arm 74 when wafers are carried into and out of the loadlock chamber 14b.

The reflective displacement sensor 114a is used to detect a wafer to determine whether a wafer is placed on the third finger 72c of the lower arm 75 when wafers are carried into and out of the process chamber 16a. Similarly, the reflective displacement sensor 114b is used to detect a wafer to determine whether a wafer is placed on the third finger 72c of the lower arm 75 when wafers are carried into and out of the process chamber 16b.

Next, with reference to FIG. 19 through Fig. 31, explanations will be given on process flows for supplying/discharging wafers between the loadlock chamber and the process chamber 16 through the carrying chamber.

In the drawings, the following processes are performed. In addition, the processes shown in FIG. 19 through FIG. 31 are sequential processes.

FIG. 19 through FIG. 22: a process of carrying non-processed wafers from the loadlock chamber to the first process chamber 16a.

Figure 23:
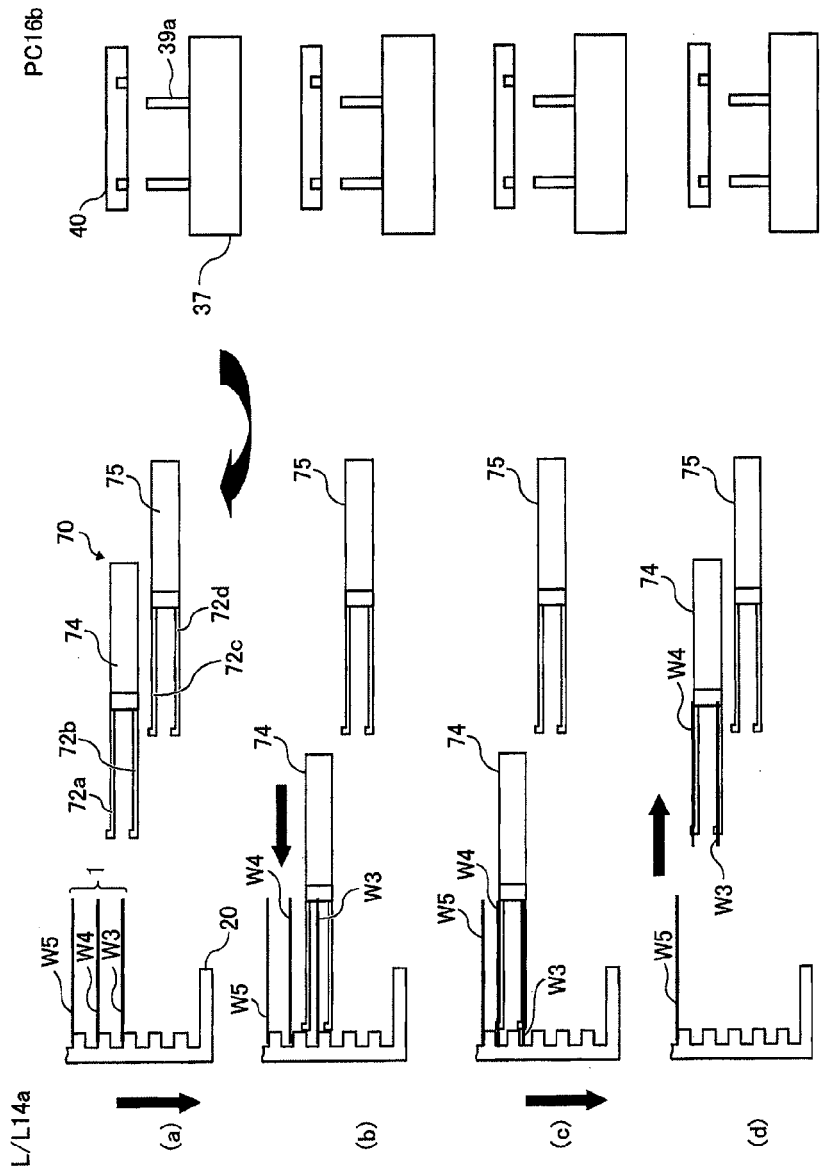
FIG. 23 is a view for explaining a substrate carrying method according to the second embodiment of the present invention.
Figure 24:
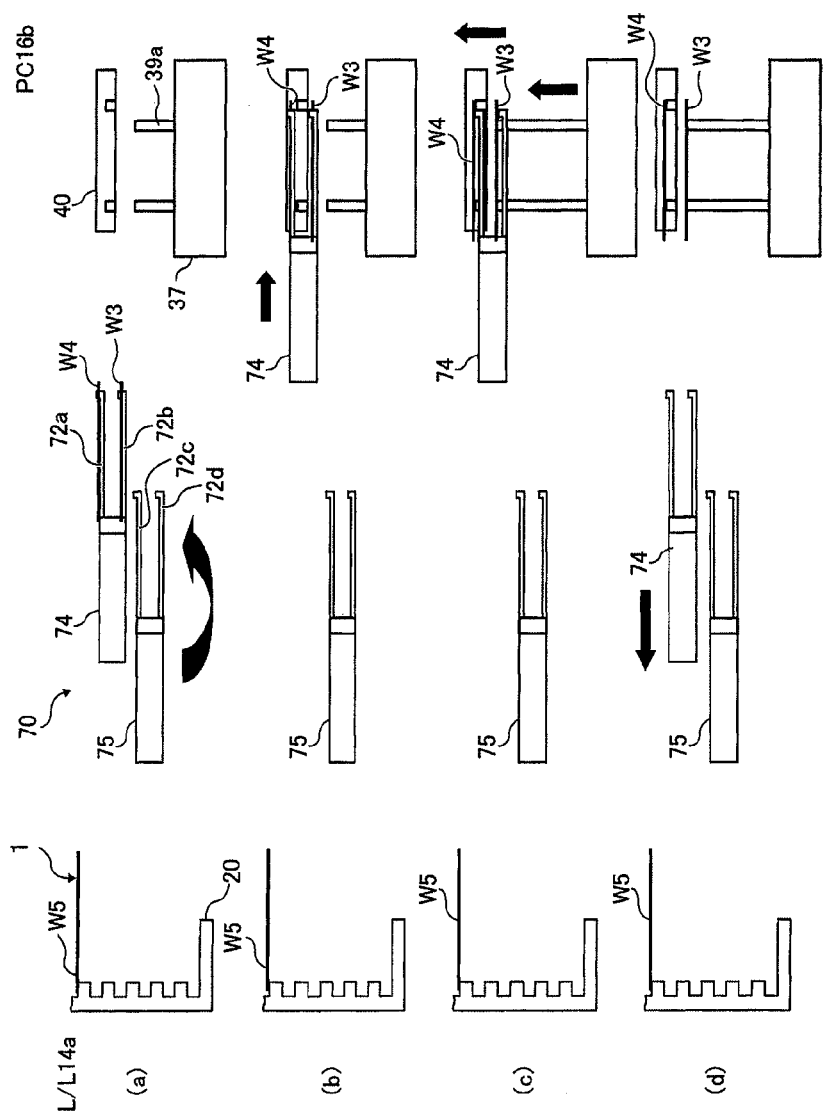
FIG. 24 is a view for explaining a substrate carrying method according to the second embodiment of the present invention.

FIG. 23 and FIG. 24: a process of carrying non-processed wafers from the loadlock chamber to the second process chamber 16b.

FIG. 25 through FIG. 31: processes of carrying non-processed wafers from the loadlock chamber to the first process chamber 16a, replacing processed wafers of the first process chamber 16a with the non-processed wafers, and carrying the processed wafers to the loadlock chamber.

Figure 19:
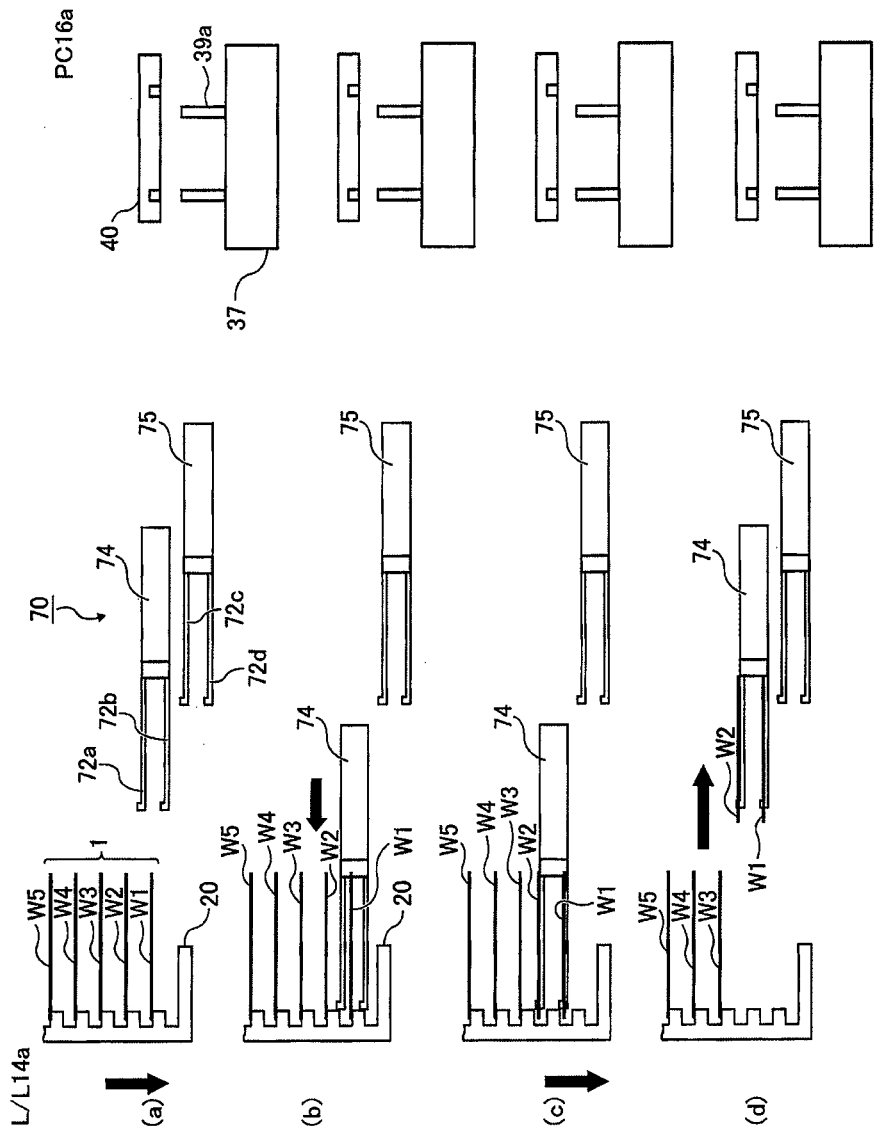
FIG. 19 is a view for explaining a substrate carrying method according to the second embodiment of the present invention.

FIG. 19 is a view for explaining an operation of carrying out wafers 1 from the loadlock chamber 14a (L/L14a). FIG. 19 shows a state where wafers 1 are first carried in the substrate processing apparatus 10 after the wafers 1 are carried from the EFEM 18 to the substrate supporter 20. Therefore, all the wafers 1 loaded on the substrate supporter 20 are non-processed wafers.

<FIG. 19: Step (a)>

First, the vertical position of the substrate supporter 20 is adjusted such that two wafers to be processed can be slightly higher than the first and second fingers 72a and 72b of the upper arm 74 of the first substrate carrying member 70.

That is, it is adjusted such that the vertical position of a first wafer W1 is higher than the vertical position of the second finger 72b. Further, the vertical positional relationship between a second wafer W2 and the first finger 72a is adjusted in the same manner.

<FIG. 19: Step (b)>

After the vertical position adjustment, the upper arm 74 is inserted into the substrate supporter 20. That is, the first finger 72b is placed just under the wafer W1, and the first finger 72a is placed just under the wafer W2.

<FIG. 19: Step (c)>

After the arm 74 is inserted, the substrate supporter 20 is moved downward.

By this, the wafers are loaded on the respective fingers.

That is, the wafer W1 is loaded on the second finger 72b, and the wafer W2 is loaded on the first finger 72a.

<FIG. 19: Step (d)>

After the wafers are loaded on the fingers, the upper arm 74 is moved toward the process chamber in a state where the orientation of the fingers is not changed. In this way, non-processed wafers are carried out of the substrate supporter 20.

Figure 20:
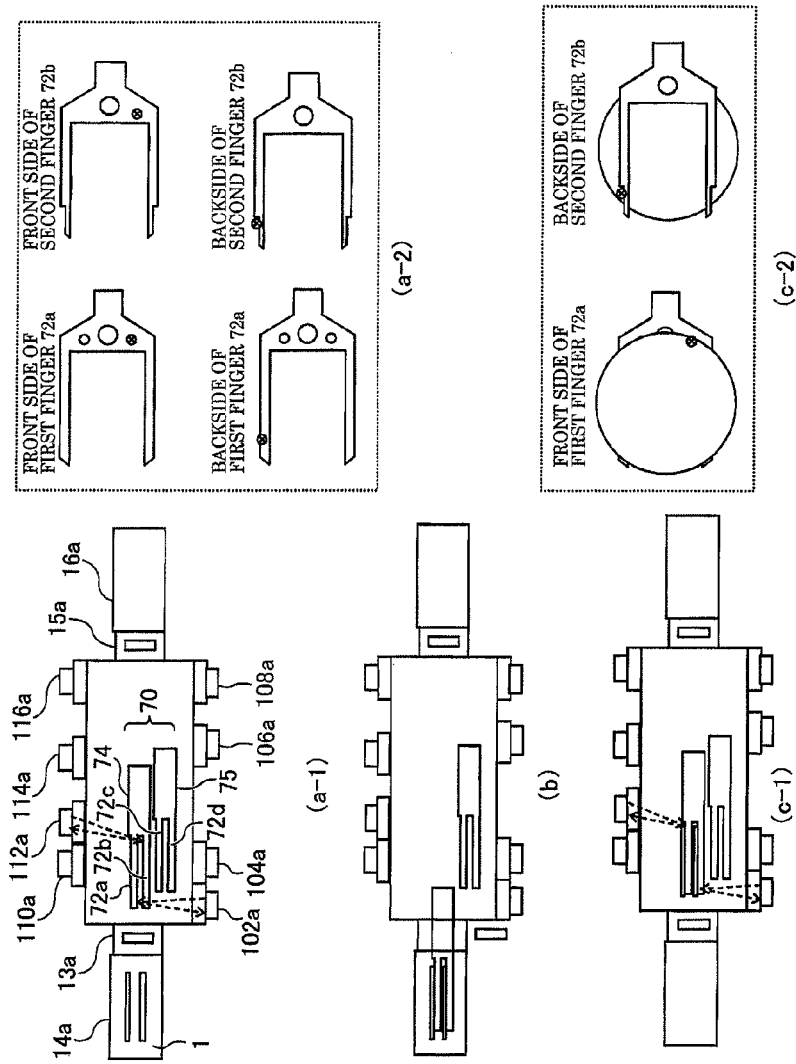
FIG. 20 is a sectional view illustrating the substrate processing apparatus according to the second embodiment of the present invention.

In the above, a method of detecting wafers by using sensors will be described with reference to FIG. 20. In FIG. 20, optical axes along which light of sensors travels are dented by mark "x."

With reference to FIG. 20, an explanation will be given on a method of detecting wafers by using sensors when wafers are carried from the loadlock chamber 14a to the carrying chamber 12.

Section (a-1) of FIG. 20 is a view illustrating a case where the first substrate carrying member 70 waits in the carrying chamber for carrying wafers out of the loadlock chamber 14a. At this time, so as to make sure that wafers are not placed on the first and second fingers 72a and 72b to which wafers will be transferred from the loadlock chamber 14a, sensors are used for wafer detection.

Section (a-2) of FIG. 20 is a view illustrating relationships between the fingers and light output from sensors in the state of section (a-1).

Hereinafter, a detailed description will be given.

The reflective displacement sensor 102a emits light in a direction from the backside of the second finger 72b (a side that is not used for placing a wafer) toward the notch 90 of the second finger 72b. Since no wafer is placed on the second finger 72b, the light passes through the notch 90 of the second finger 72b and is incident on the backside of the leading end of the first finger 72a. Then, the light is reflected and passes again through the notch 90 of the second finger 72b, such that the reflective displacement sensor 102a can receive the light. In this way, a distance can be measured. Thereafter, the measured distance is compared with a reference value of the reflective displacement sensor 102a (a distance between the first finger 72a and the reflective displacement sensor 102a) which is previously stored in the controller 84, and if the difference is within a tolerance range, it can be known that no wafer is placed on the second finger 72b.

On the other hand, if the measured distance between the reflective displacement sensor 102a and the first finger 72a is different from the reference value within the tolerance range, it is determined that there exists a substrate or an error. In this case, the operation of the carrying chamber 12 may be stopped, or an alarm signal may be output for a maintenance worker.

The reflective displacement sensor 112a emits light toward the second penetration hole 86 of the first finger 72a. The emitted light passes through the second penetration hole 86 and is incident on the supporting part 80 of the second finger 72b. Then, the light is reflected and passes again through the second penetration hole 86, such that the reflective displacement sensor 112a can receive the light. In this way, a distance can be measured. That is, the distance between the reflective displacement sensor 112a and the second finger 72b is measured. The measured distance is compared with a reference value of the reflective displacement sensor 112a (the distance between the second finger 72b and the reflective displacement sensor 112a) which is previously stored in the controller 84, and if the difference is within a tolerance range, it can be known that no wafer is placed on the first finger 72a.

On the other hand, if the measured distance is different from the reference value by more than the tolerance range, it is determined that there exists a substrate or an error. In this case, the operation of the carrying chamber 12 may be stopped, or an alarm signal may be output for a maintenance worker.

If it is determined that no wafer is placed on each finger, the gate valve 35 of the first substrate pass port 13a is opened. Thereafter, as shown section (b), the upper arm 74 is moved toward the loadlock chamber 14a.

At this time, the substrate supporter 20 is moved relative to the first and second fingers 72a and 72b so as to transfer wafers to the first and second fingers 72a and 72b.

After wafers are held on the upper arm 74, the upper arm 74 is moved to the carrying chamber 12, and the gate valve 35 is closed.

If the upper arm 74 returns to the carrying chamber 12, it is determined whether wafers are loaded on the upper arm 74. Section (c-1) is a view provided for illustrative purpose, and section (c-2) is a view illustrating relationships between the fingers and light output from sensors in the state of section (c-1).

The reflective displacement sensor 102a emits light in a direction from the backside of the second finger 72b (a side that is not used for placing a wafer) toward the notch 90 of the second finger 72b. Since a wafer is placed on the second finger 72b including the notch 90, an optical axis is blocked by the wafer, and thus the light is reflected from the backside of the wafer. The light reflected from the backside of the wafer is incident on the reflective displacement sensor 102a. In this way, a distance can be measured. That is, the distance between the reflective displacement sensor 102a and the second finger 72b is measured. Since the measured distance is different from the above-mentioned reference value of the reflective displacement sensor 102a (the distance between the first finger 72a and the reflective displacement sensor 102a), it can be known that a wafer is placed on the second finger 72b.

At this time, if the measured distance is different from the reference value and is largely different from the distance between the reflective displacement sensor and the second finger 72b, it is determined that there exists no wafer or an error. In this case, the operation of the carrying chamber 12 may be stopped, or an alarm signal may be output for a maintenance worker.

The reflective displacement sensor 112a emits light toward the second penetration hole 86 of the first finger 72a. Then, the light is reflected by the wafer placed on the first finger 72a. The reflected light is incident on the reflective displacement sensor 112a. In this way, a distance can be measured. That is, the measured distance is different from the above-mentioned reference value of the reflective displacement sensor 112a (the distance between the reflective displacement sensor 112a and the second finger 72b), it can be known that a wafer is placed on the first finger 72a.

At this time, if the measured distance is different from the reference value and is largely different from the reflective displacement sensor and the first finger 72a, it is determined that there exists no wafer or an error. In this case, the operation of the carrying chamber 12 may be stopped, or an alarm signal may be output for a maintenance worker.

Next, with reference to FIG. 21, an explanation will be given on an operation of carrying the wafers carried out in FIG. 19 into the process chamber 16a (PC16a). The carrying-in operation of FIG. 21 is performed sequentially after the carrying-out operation of FIG. 19.

Figure 21:
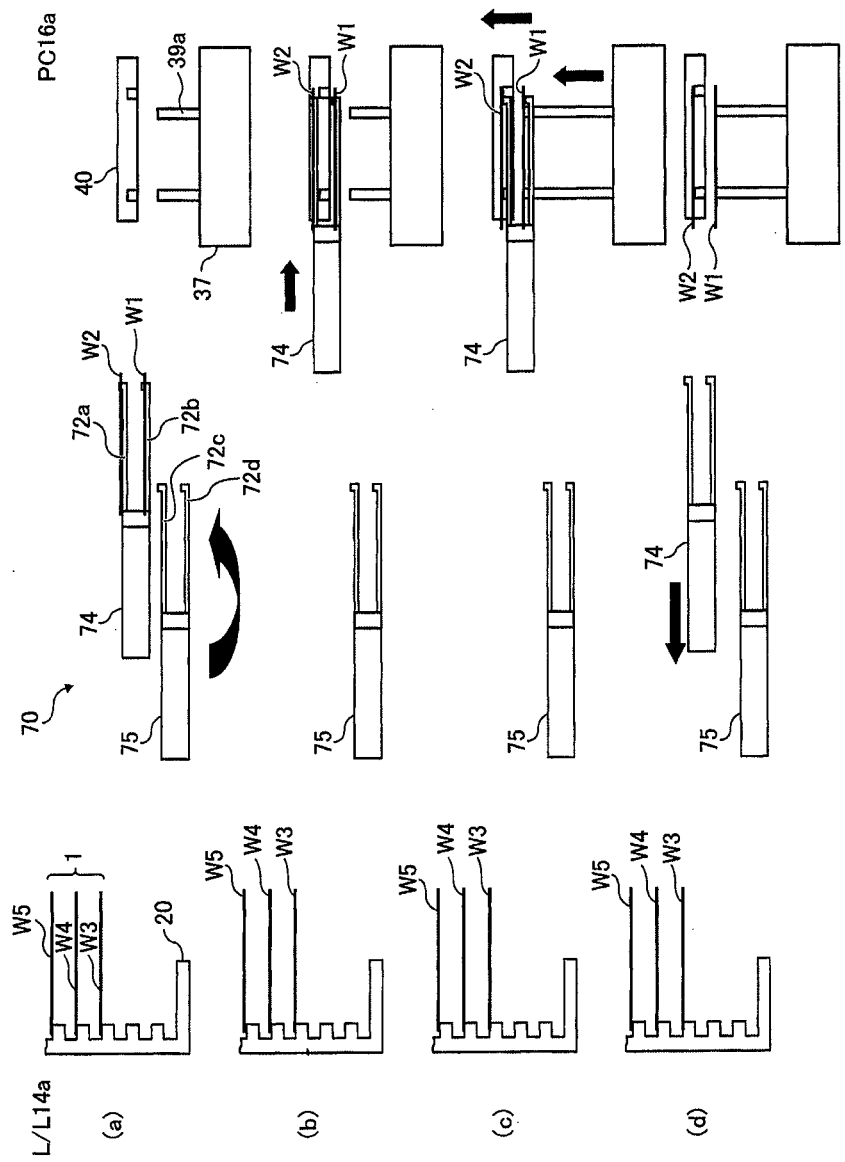
FIG. 21 is a view for explaining a substrate carrying method according to the second embodiment of the present invention.

<FIG. 21: Step (a)>

The upper arm 74 loaded with the wafers is rotated together with the lower arm 75 such that the leading ends of the first and second fingers 72a and 72b are pointed toward the process chamber 16a.

<FIG. 21: Step (b)>

In the process chamber 16a, the first substrate holding pins 39a and the second substrate carrying member 40 are in a standby state.

The arm 74 is horizontally inserted into the process chamber 16a such that the wafers are placed above the first substrate stage 37 of the process chamber 16a and the vertical positions of the respective wafers are located just above the first substrate holding pins 39a and the second substrate carrying member 40.

That is, the wafer W1 loaded on the second finger 72b is placed just above the first substrate holding pins 39a, and the wafer W2 loaded on the first finger 72a is placed just above the second substrate carrying member 40.

<FIG. 21: Step (c)>

After the respective wafers are placed above the first substrate stage 37, the first substrate holding pins 39a and the second substrate carrying member 40 are moved upward so as to lift the wafers.

That is, the wafer W1 loaded on the second finger 72b is loaded on the first substrate holding pins 39a, and the wafer W2 loaded on the first finger 72a is loaded on the second substrate carrying member 40.

<FIG. 21: Step (d)>

After the wafers are transferred from the respective fingers to the first substrate holding pins 39a and the second substrate carrying member 40, the upper arm 74 is moved away from the process chamber 16a.

Next, with reference to FIG. 22, an explanation will be given on a method of detecting a wafer in the case where wafers are carried from the loadlock chamber 14a to the process chamber 16a.

After the upper arm 74 carries the wafers from the loadlock chamber as shown in section (c) of FIG. 20, the upper arm 74 is rotated together with the lower arm 75 such that the leading ends of the fingers are pointed toward the substrate pass port 15a. As a result, the upper arm 74 waits in the carrying chamber 12 in a state shown in section (a) of FIG. 22.

Figure 22:
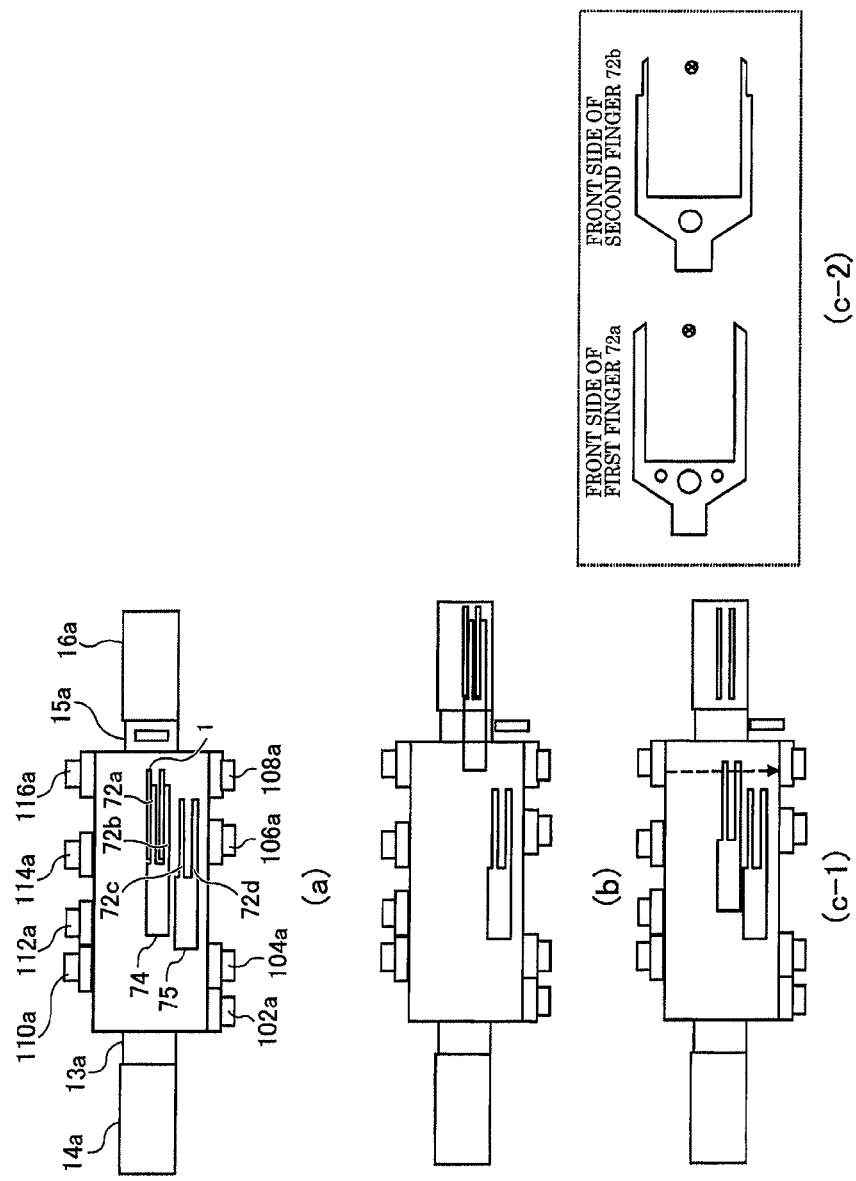
FIG. 22 is a sectional view illustrating the substrate processing apparatus according to the second embodiment of the present invention.

Next, the gate valve 35 is opened, and the upper arm 74 is moved toward the first process chamber 16a as shown in section (b) of FIG. 22.

At this time, by cooperative operations of the first substrate holding pins 39a and the upper arm 74, the wafers are placed in the first process chamber 16a.

After the wafers are transferred to the first process chamber 16a, the upper arm 74 is moved toward the carrying chamber 12. After the movement, the gate valve 35 is closed, and the state shown in section (c-1) of FIG. 22 is obtained.

In the state shown in section (c-1) of FIG. 22, whether a wafer is placed on the upper arm 74 is determined as follows. That is, light is emitted from the transmissive sensor light projecting unit 116a toward the transmissive sensor light receiving unit 108a. As shown in section (c-2) of FIG. 22, the light passes between both leading ends of each finger. If the transmissive sensor light receiving unit 108a receives the light, it is determined that no wafer is placed on each of the arms.

Here, if the transmissive sensor light receiving unit 108a does not receive the light, it is determined that a wafer is placed on at least one of the arms or the apparatus behaves abnormally. In this case, the operation of the carrying chamber 12 may be stopped, or an alarm signal may be output for a maintenance worker.

FIG. 23 is a view for explaining an operation of carrying out wafers 1 from the loadlock chamber 14a (L/L14a).

<FIG. 23: Step (a)>
First, the vertical position of the substrate supporter 20 is adjusted such that two wafers to be processed can be slightly higher than the first and second fingers 72a and 72b of the upper arm 74.

That is, it is adjusted such that the vertical position of a third wafer W3 is higher than the vertical position of the second finger 72b. Further, the vertical positional relationship between a fourth wafer W4 and the first finger 72a is adjusted in the same manner.

<FIG. 23: Step (b)>
After the vertical position adjustment, the upper arm 74 is inserted into the substrate supporter 20. That is, the second finger 72b is placed just under the wafer W3, and the first finger 72a is placed just under the wafer W4.

<FIG. 23: Step (c)>
After the upper arm 74 is inserted, the substrate supporter 20 is moved downward.

By this, wafers are loaded on the respective fingers.

That is, the wafer W3 is loaded on the second finger 72b, and the wafer W4 is loaded on the first finger 72a.

<FIG. 23: Step (d)>
After the wafers are loaded on the fingers, the upper arm 74 is moved toward the process chamber in a state where the orientation of the fingers is not changed. In this way, non-processed wafers are carried out of the substrate supporter 20.

Next, with reference to FIG. 24, an explanation will be given on an operation of carrying the wafers carried out in FIG. 23 into the process chamber 16b (PC16b). The carrying-in operation of FIG. 24 is performed sequentially after the carrying-out operation of FIG. 23.

<FIG. 24: Step (a)>
The upper arm 74 loaded with the wafers is rotated such that the leading ends of the first and second fingers 72a and 72b are pointed toward the process chamber 16b.

<FIG. 24: Step (b)>
In the process chamber 16b, the first substrate holding pins 39a and the second substrate carrying member 40 are in a standby state.

The upper arm 74 is horizontally inserted into the process chamber 16b such that the wafers are placed above the first substrate stage 37 of the process chamber 16b and the vertical positions of the respective wafers are located just above the first substrate holding pins 39a and the second substrate carrying member 40.

That is, the wafer W3 loaded on the second finger 72b is placed just above the first substrate holding pins 39a, and the wafer W2 loaded on the first finger 72a is placed just above the second substrate carrying member 40.

<FIG. 24: Step (c)>
After the respective wafers are placed above the first substrate stage 37, the first substrate holding pins 39a and the second substrate carrying member 40 are moved upward so as to lift the wafers.

That is, the wafer W3 loaded on the second finger 72b is loaded on the first substrate holding pins 39a, and the wafer W2 loaded on the first finger 72a is loaded on the second substrate carrying member 40.

<FIG. 24: Step (d)>
After the wafers are transferred from the respective fingers to the first substrate holding pins 39a and the second substrate carrying member 40, the upper arm 74 is moved away from the process chamber 16b.

Operations after substrates are carried into the process chambers 16a and 16b are the same as those shown in FIG. 13 and FIG. 13 in the first embodiment, and thus descriptions thereof will not be repeated.

Figure 25:
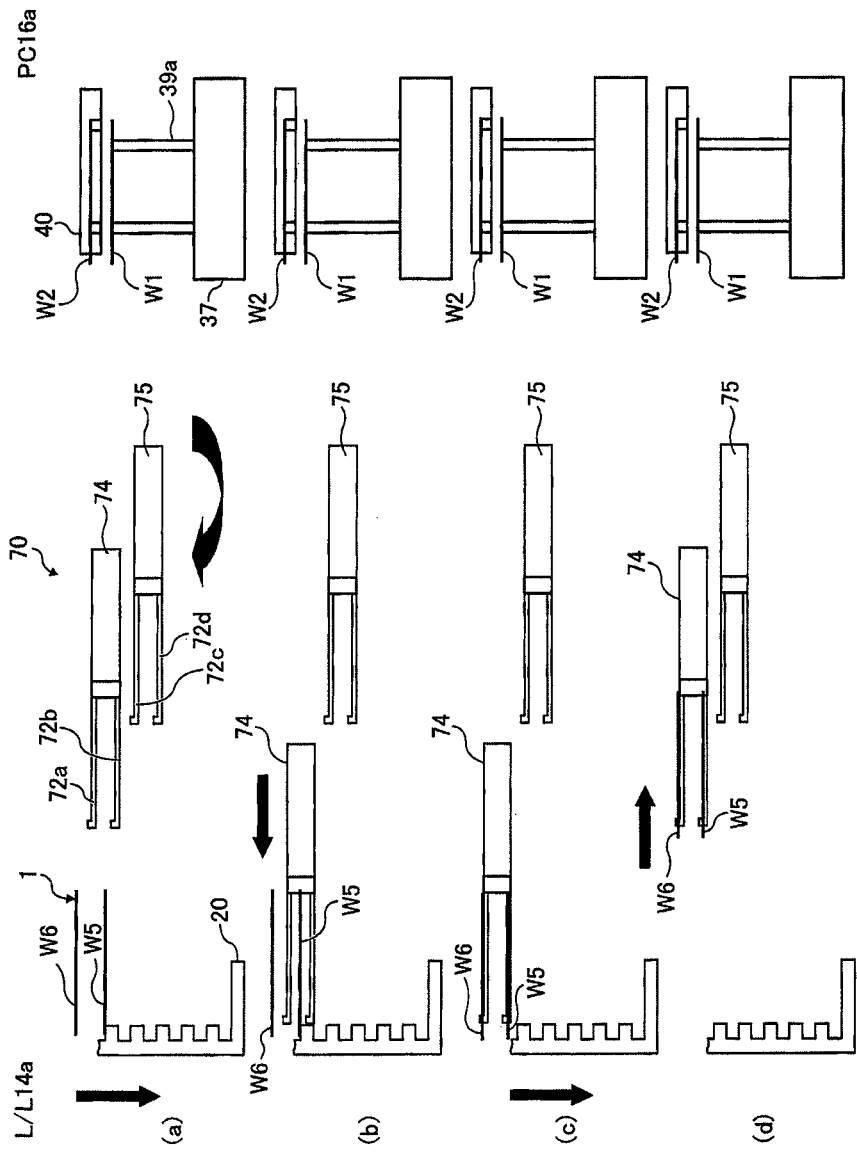
FIG. 25 is a view for explaining a substrate carrying method according to the second embodiment of the present invention.

FIG. 25 is a view for explaining an operation of carrying out wafers from the loadlock chamber 14a (L/L 14a) in a state where wafers are placed in the process chamber 16a.

<FIG. 25: Step (a)>
The vertical position of the substrate supporter 20 is adjusted such that two wafers to be processed can be slightly higher than the first and second fingers 72a and 72b of the upper arm 74.

That is, it is adjusted such that the vertical position of a fifth wafer W5 is higher than the vertical position of the second finger 72b. Further, the vertical positional relationship between a sixth wafer W6 and the first finger 72a is adjusted in the same manner.

<FIG. 25: Step (b)>
After the vertical position adjustment, the upper arm 74 is inserted into the substrate supporter 20. That is, the first finger 72b is placed just under the wafer W5, and the first finger 72a is placed just under the wafer W6.

<FIG. 25: Step (c)>
After the arm 74 is inserted, the substrate supporter 20 is moved downward.

By this, the wafers are loaded on the respective fingers.

That is, the wafer W5 is loaded on the second finger 72b, and the wafer W6 is loaded on the first finger 72a.

<FIG. 25: Step (d)>
After the wafers are loaded on the fingers, the upper arm 74 is moved toward the process chamber in a state where the orientation of the fingers is not changed. In this way, non-processed wafers are carried out of the substrate supporter 20.

Next, with reference to FIG. 26, an operation of replacing processed wafers with non-processed wafers will be described. As described above, the non-processed wafers are the wafers W5 and W6, which are loaded on the second finger 72b and the first finger 72a of the upper arm 74, respectively. The processed wafers are the wafer W2 loaded on the second substrate carrying member 40 and the wafer W1 loaded on the first substrate holding pins 39a.

Figure 26:
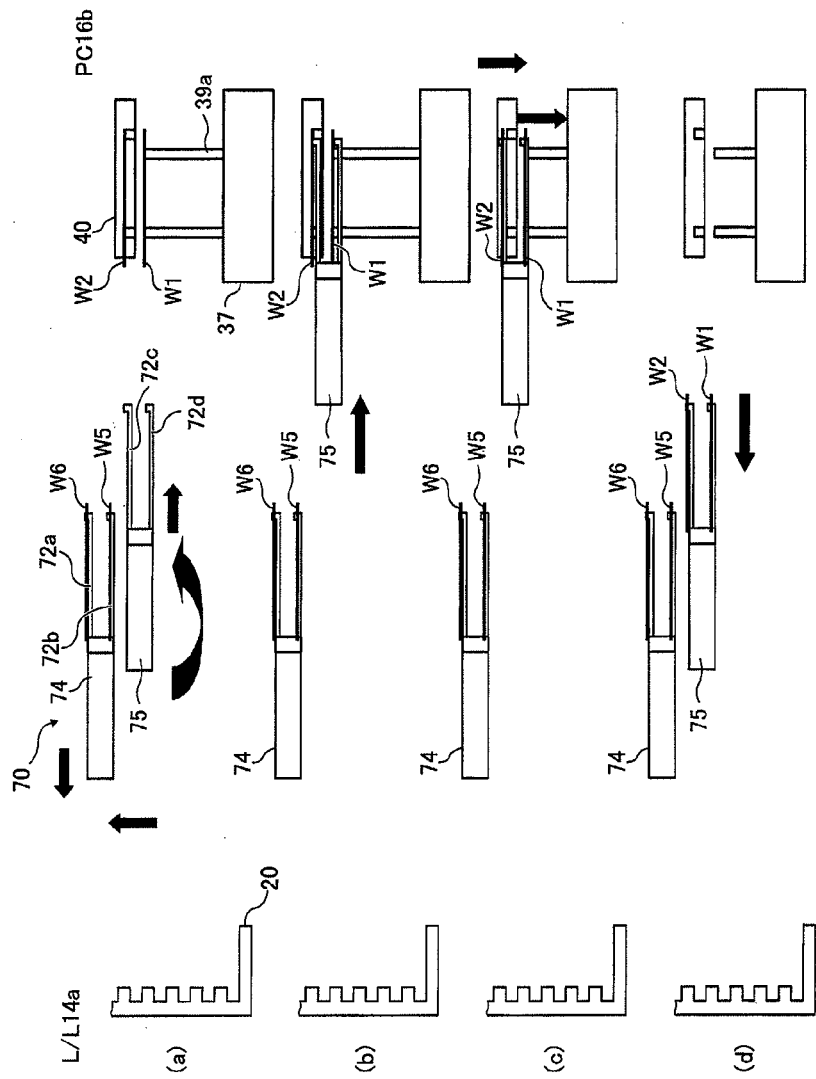
FIG. 26 is a view for explaining a substrate carrying method according to the second embodiment of the present invention.

<FIG. 26: Step (a)>
When substrates are carried out, the wafer W1 processed at the first process unit of the process chamber 16a is loaded on the first substrate holding pins 39a. In addition, the wafer W2 processed at the second process unit is loaded on the second substrate carrying member 40. The wafers are held above the first substrate stage 37.

Meanwhile, the upper arm 74 loaded with the wafers carried out from the loadlock chamber 14a is rotated together with the lower arm 75 such that the leading ends of the fingers are pointed toward the process chamber 16a. In addition, at the same time with the rotation, the upper arm 74 and the lower arm 75 are lifted together. By this, the vertical positions of the arms can be aligned with the substrate pass port 15a, so as to allow the lower arm 75 and the fingers of the lower arm 75 to pass through the substrate pass port 15a rapidly for receiving the processed wafers. In this way, since the heights of the arms are aligned with the substrate pass port when the arms are rotated, vertical position adjustment is not necessary in a later step, and thus substrates can be rapidly carried out.

At this time, the vertical positions are as follows: the wafer loaded on the second substrate carrying member 40 is higher than the third finger 72c of the lower arm 75, and the wafer loaded on the first substrate holding pins 39a is higher than the fourth finger 72d.

<FIG. 26: Step (b)>

The lower arm 75 is inserted into the process chamber 16a.

At this time, the third finger 72c is placed just under the wafer loaded on the second substrate carrying member 40, and the fourth finger 72d is placed just under the wafer loaded on the first substrate holding pins 39a.

<FIG. 26: Step (c)>

The second substrate carrying member 40 and the first substrate holding pins 39a are moved downward. By this, the wafers can be loaded on the fingers.

That is, the wafer loaded on the second substrate carrying member 40 is transferred to the third finger 72c, and the wafer loaded on the first substrate holding pins 39a is transferred to the fourth finger 72d.

<FIG. 26: Step (d)>

After the wafers are transferred to the fingers, the arm 75 is moved away from the process chamber 16a.

Next, with reference to FIG. 27, an explanation will be given on a method of detecting a wafer in the case where wafers are carried from the process chamber 16a to the carrying chamber 12.

Figure 27:
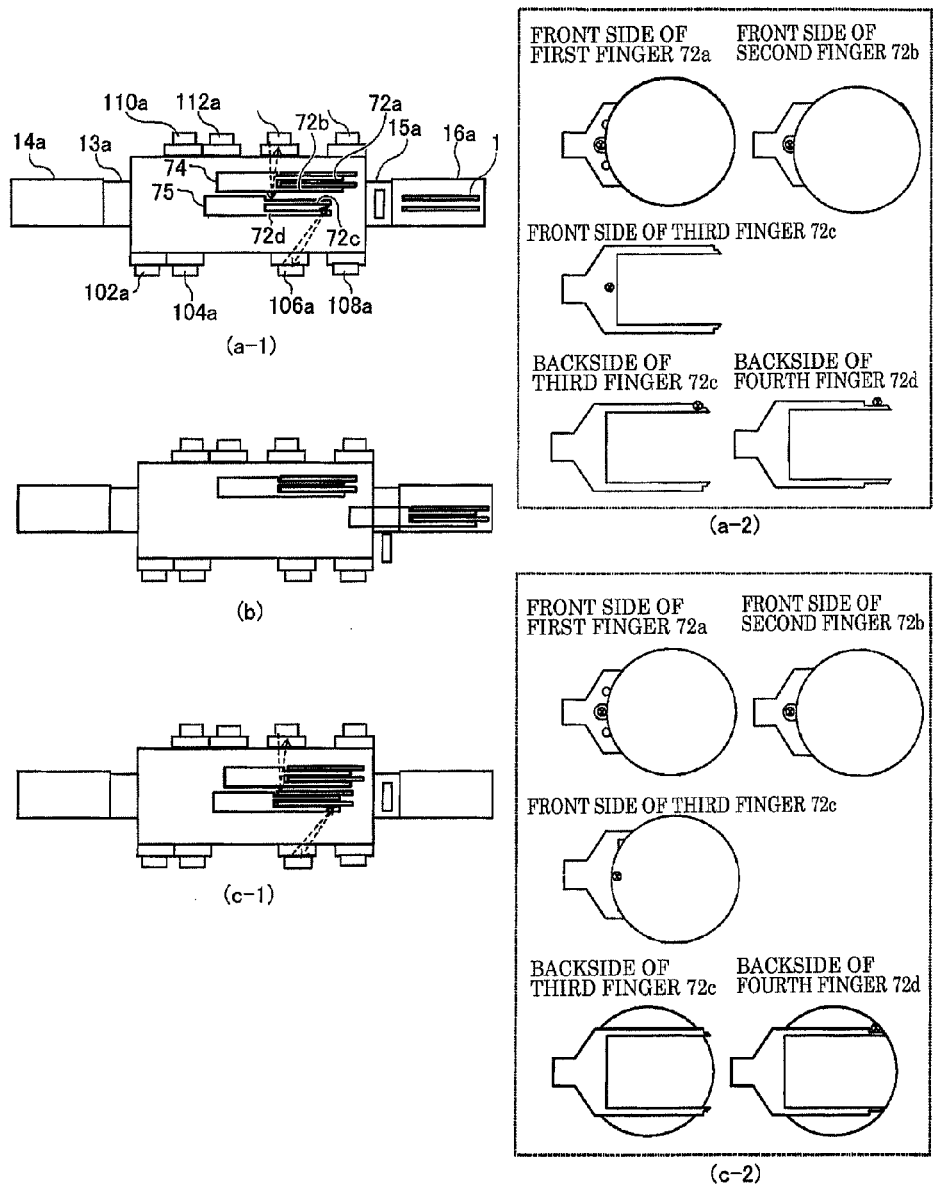
FIG. 27 is a sectional view illustrating the substrate processing apparatus according to the second embodiment of the present invention.

Section (a-1) of FIG. 27 illustrates a state where non-processed wafers loaded on the upper arm 74 are waiting in the carrying chamber 12. To load processed wafers on the lower arm 75, the height of the lower arm 75 is set to be equal to the height of the substrate pass port 15a. In addition, section (a-2) is a view illustrating relationships between the fingers and light (optical axes) output from sensors.

The reflective displacement sensor 106a emits light in a direction from the backside of the fourth finger 72d toward the notch 100b of the fourth finger 72d. The light passes through the notch 100b and is incident on the backside of the third finger 72c. Then, the light is reflected and passes again through the notch 100b, so that the reflective displacement sensor 106a can receive the light.

A distance measured in this way is compared with a preset reference value (a distance between the third finger 72c and the reflective displacement sensor 106a that is preset for the case of carrying out processed wafers), and the difference is within a tolerance range, it is determined that no wafer is placed on the fourth finger 72d.

If the measured distance is largely different from the reference value, it is determined that a wafer is held on the fourth finger 72d or there is an error. In this case, the operation of the carrying chamber 12 may be stopped, or an alarm signal may be output for a maintenance worker.

The reflective displacement sensor 114a emits light in a direction from the front side of the first finger 72a toward the first penetration hole 85 of the first finger 72a. As shown in section (a-2), the emitted light passes through the supporting part side 85b of the first penetration hole 85 of the first finger 72a, and the supporting part side 92b of the penetration hole 92 of the second finger 72b, and then the light is incident on the supporting part 80 of the third finger 72c. Then, the light is reflected from the supporting part 80 of the third finger 72c and passes through the supporting part side 92b of the penetration hole 92 and the supporting part side 85b of the first penetration hole 85, so that the reflective displacement sensor 114a can receive the light.

A distance measured in this way is compared with a preset reference value (a distance between the third finger 72c and the reflective displacement sensor 114a that is preset for the case of carrying out processed wafers), and the difference is within a tolerance range, it is determined that no wafer is placed on the third finger 72c.

If the measured distance is largely different from the reference value, it is determined that a wafer is held on the third finger 72c or there is an error. In this case, the operation of the carrying chamber 12 may be stopped, or an alarm signal may be output for a maintenance worker.

If it is determined that no wafer is placed on the third and fourth fingers 72c and 72d, the gate valve 35 is opened, as shown in section (b), the lower arm 75 is moved to the process chamber 16a. After that, by cooperative operation with the first substrate holding pins 39a, the processed wafers of the process chamber 16a are transferred to the fingers of the lower arm 75.

After the wafers are placed on the fingers of the lower arm 75, as shown in section (c-1), the lower arm 75 is moved to the carrying chamber 12. Thereafter, by using sensors, it is determined whether wafers are placed on the respective fingers of the lower arm 75. Section (c-2) is a view illustrating relationships between the fingers and light (optical axes) output from the sensors at that time.

The reflective displacement sensor 106a emits light in a direction from the backside of the fourth finger 72d toward the notch 100b of the fourth finger 72d. Then, the light is incident on the backside of the wafer held on the fourth finger 72d. The light reflected from the backside of the wafer is received by the reflective displacement sensor 106a

A distance measured in this way is compared with the preset reference value (the distance between the third finger 72c and the reflective displacement sensor 106a that is preset for the case of carrying out processed wafers), and if the measured distance is different from the reference value, it is determined that a wafer is placed on the fourth finger 72d.

If the measured distance is largely different from the reference value and is different from the distance between the fourth finger 72d and the reflective displacement sensor 106a, it is determined that no wafer is held on the fourth finger 72d or there is an error. In this case, the operation of the carrying chamber 12 may be stopped, or an alarm signal may be output for a maintenance worker.

The reflective displacement sensor 114a emits light in a direction from the front side of the first finger 72a toward the first penetration hole 85 of the first finger 72a. As shown in section (c-2), the emitted light passes through the supporting part side 85b of the first penetration hole 85 of the first finger 72a, and the supporting part side 92b of the penetration hole 92 of the second finger 72b, and then the light is incident on the wafer held on the third finger 72c. Then, the light is reflected from the wafer and passes through the supporting part side 92b of the penetration hole 92 and the supporting part side 85b of the first penetration hole 85, so that the reflective displacement sensor 114a can receive the light.

A distance measured in this way is compared with the preset reference value (the distance between the third finger 72c and the reflective displacement sensor 114a that is preset for the case of carrying out wafers), and if the difference is out of a tolerance range, it is determined that a wafer is held on the third finger 72c.

If the measured distance is largely different from the reference value, it is determined that a wafer is held on the third finger 72c or there is an error. In this case, the operation of the carrying chamber 12 may be stopped, or an alarm signal may be output for a maintenance worker.

Next, with reference to FIG. 28, an explanation will be given on an operation of carrying the wafers, which are carried out in FIG. 26, into the process chamber 16a (PC16a).

Figure 28:
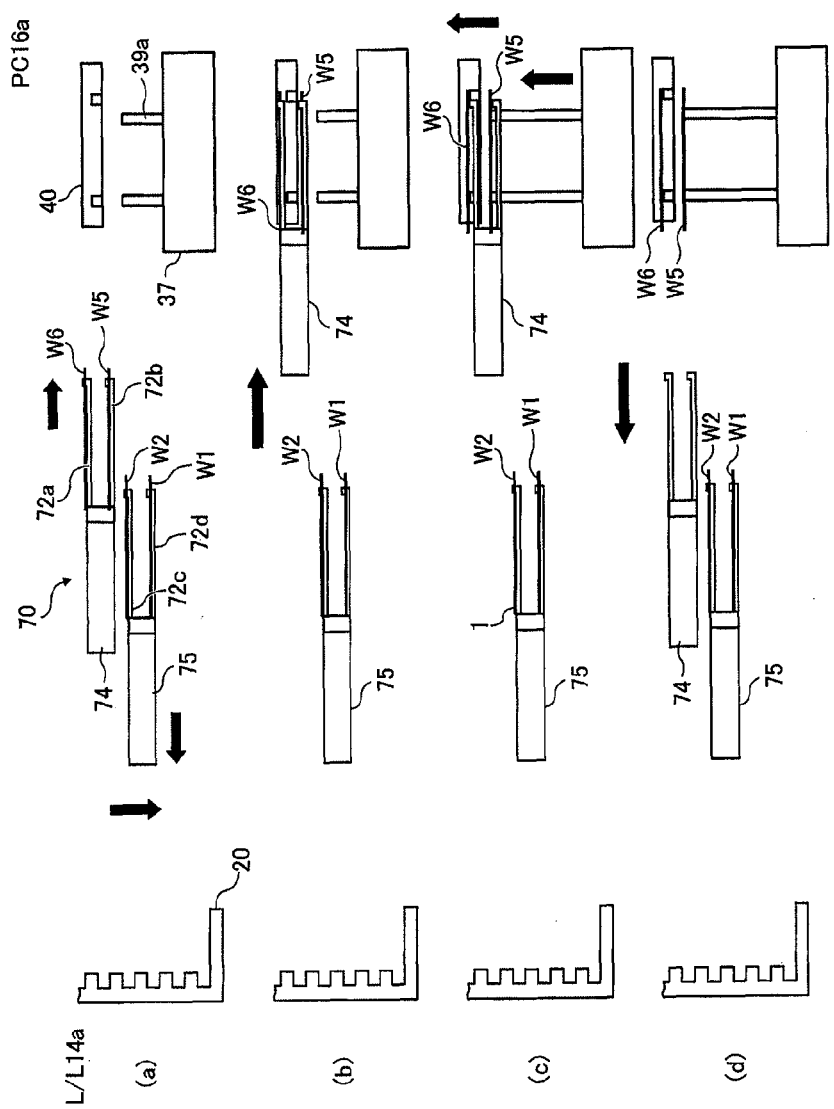
FIG. 28 is a view for explaining a substrate carrying method according to the second embodiment of the present invention.

The carrying-in operation of FIG. 28 is sequentially performed after the carrying-out operation of FIG. 26.

<FIG. 28: Step (a)>

When the lower arm 75 loaded with the processed wafers is moved backward, the upper and lower arms 74 and 75 are lowered together.

By this, the vertical position of the upper arm 74 is aligned with the substrate pass port 15a, so as to allow the upper arm 74 and the fingers of the upper arm 74 to pass through the substrate pass port 15a for carrying in non-processed wafers.

Thereafter, the upper arm 74 loaded with the non-processed wafers is inserted into the process chamber 16.

At this time, vertical positions are set as follows: the wafer loaded o the first finger 72a is higher than the second substrate carrying member 40, and the wafer loaded on the second finger 72b is higher than the second substrate holding pins 39b.

<FIG. 28: Step (b)>

The arm 74 is horizontally inserted into the process chamber 16a such that the wafers are placed above the first substrate stage 37 of the process chamber 16b and the vertical positions of the respective wafers are located just above the first substrate holding pins 39a and the second substrate carrying member 40.

That is, the wafer W5 loaded on the second finger 72b is placed just above the first substrate holding pins 39a, and the wafer W6 loaded on the first finger 72a is placed just above the second substrate carrying member 40.

<FIG. 28: Step (c)>

After the respective wafers are placed above the first substrate stage 37, the first substrate holding pins 39a and the second substrate carrying member 40 are moved upward so as to lift the wafers.

That is, the wafer W5 loaded on the second finger 72b is loaded on the first substrate holding pins 39a, and the wafer W6 loaded on the first finger 72a is loaded on the second substrate carrying member 40.

<FIG. 28: Step (d)>

After the wafers are transferred from the respective fingers to the first substrate holding pins 39a and the second substrate carrying member 40, the upper arm 74 is moved away from the process chamber 16a.

Next, with reference to FIG. 29, an explanation will be given on an operation of carrying the processed wafers, which are carried out of the process chamber 16a, to the loadlock chamber 14a.

Figure 29:
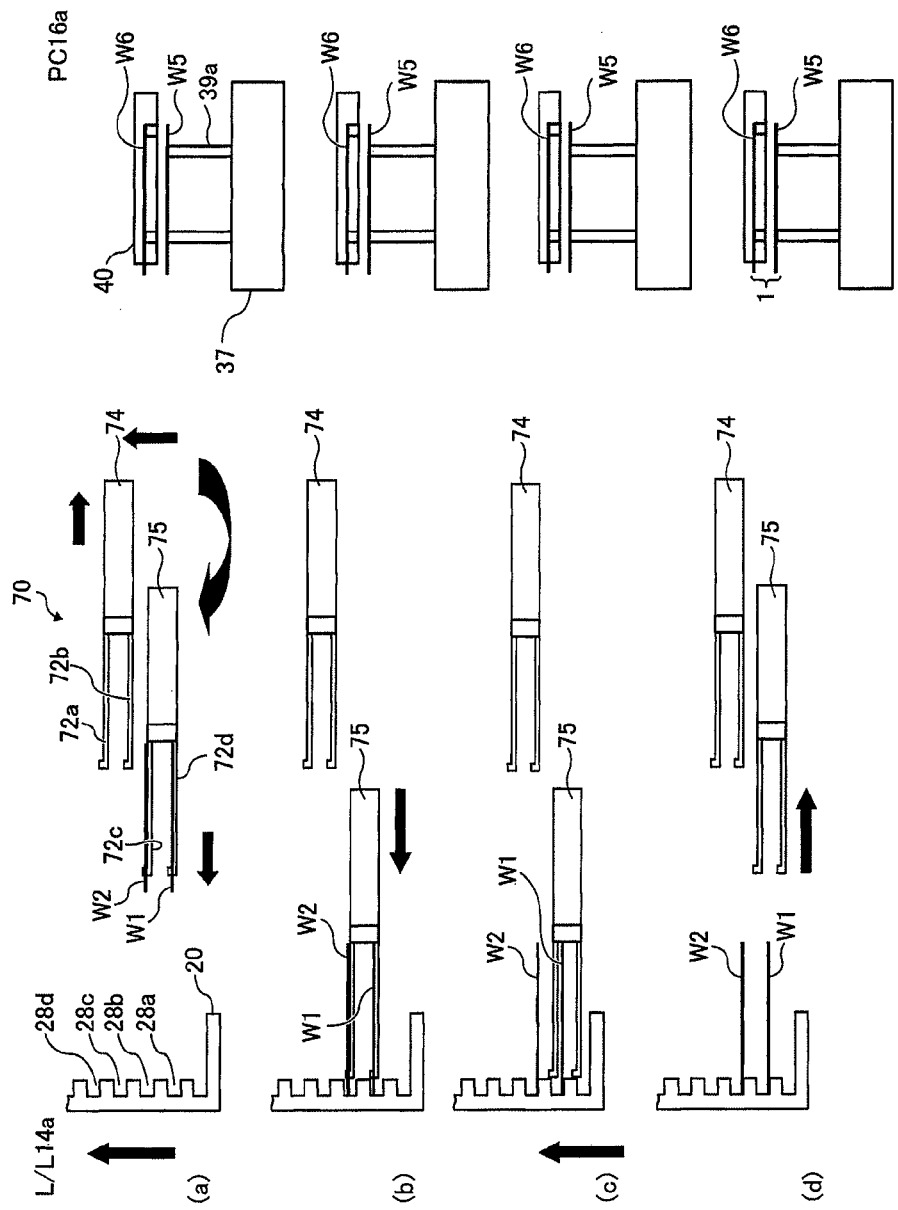
FIG. 29 is a view for explaining a substrate carrying method according to the second embodiment of the present invention.

<Fig. 29: step (a)>

The upper and lower arms 74 and 75 moved away from the process chamber 16a are rotated such that the leading ends of the fingers are pointed toward the loadlock chamber 14a.

In addition, at this time, the position of the substrate supporter 20 is changed as follows.

That is, so as to load the wafers on the original resting parts 28 (where the wafers are originally placed when the wafers are loaded from the EFEM 18 to the substrate supporter before being processed), the original resting parts are set to be lower than the vertical positions of the wafers, respectively, but the vertical positions of the wafers are lower than the next upper original resting parts, respectively.

In detail, the position of the substrate supporter 20 is adjusted such that the position of the resting part 28a for the processed wafer W1 is set to be lower than the processed wafer W1 but the processed wafer W1 is lower than the resting part 28b that is located just above the resting part 28a.

Since the substrate supporter 20 is moved downward in the previous operation (the operation of carrying out the wafers W3 and W4 as shown in FIG. 7), when the wafers W1 and W2 are carried back to the substrate supporter 20, the substrate supporter 20 is moved upward so as to place the substrate supporter 20 at the above-described set position.

In addition, the lower arm 75 which holds the processed wafers is moved upward together with the upper arm 74 so that the vertical position of the lower arm 75 can be aligned with the vertical position of the substrate pass port 13a between the loadlock chamber 14a and the carrying chamber 12.

Although the example of carrying the wafers W1 and W2 has been only described, other wafers are carried by setting positions in the same way as described above.

<Fig. 29: step (b)>

After the position of the substrate supporter 20 is set, the lower arm 75 is inserted in the direction of the substrate supporter 20.

That is, the wafer W1 loaded on the fourth finger 72d is held between the topside of the resting part 28a and the bottom side of the resting part 28b, and the wafer W2 loaded on the third finger 72c is held between the topside of the resting part 28b and the bottom side of the resting part 28c.

<Fig. 29: step (c)>

After the position of each part is set, the substrate supporter 20 is moved upward. By this, the respective resting parts push the wafers upward, and thus the wafers are transferred to the resting parts.

<FIG. 29: Step (d)>

After the wafers are transferred from the fingers to the substrate supporter 20, the lower arm 75 is moved away from the loadlock chamber 14a.

After the operation of FIG. 29, the next non-processed wafers are carried out as shown in FIG. 25, and processed wafers are replaced with the non-processed wafers as shown in FIG. 26 and FIG. 28.

In this way, wafer carrying operations are performed by cooperatively operating the substrate supporter 20, the first substrate carrying member 70 (the arms 74 and 75), the second substrate carrying member 40, and the first substrate holding pins 39.

Next, with reference to FIG. 30, an explanation will be given on a method of detecting a wafer for an operation of carrying processed wafers from the process chamber 16a. The processed wafers accommodated in the process chamber 16a are the last wafers to be transferred to the substrate supporter 20 of the loadlock chamber 14a. Therefore, non-processed wafers are not loaded on the upper arm 74.

Figure 30:
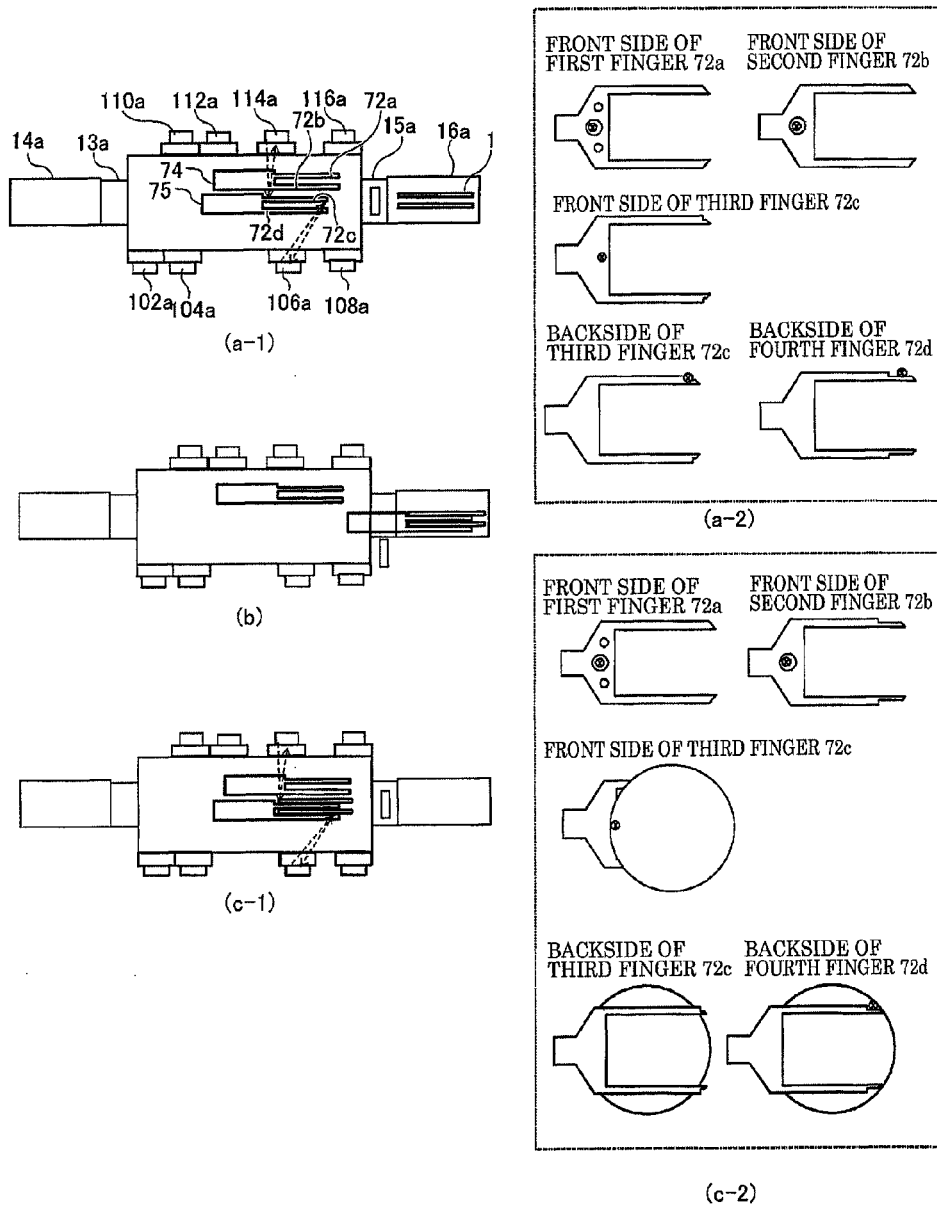
FIG. 30 is a sectional view illustrating the substrate processing apparatus according to the second embodiment of the present invention.

Section (a-1) of FIG. 30 illustrates a state where non-processed wafers loaded on the lower arm 74 are waiting in the carrying chamber 12. So as to transfer processed wafers on the lower arm 75, the height of the lower arm 75 is adjusted to be equal to the height of the substrate pass port 15a. In addition, section (a-2) is a view illustrating relationships between the fingers and light (optical axes) output from sensors.

The reflective displacement sensor 106a emits light in a direction from the backside of the fourth finger 72d toward the basis of the notch 100b of the fourth finger 72d. The light passes through the notch 100b and is incident on the backside of the third finger 72c. Then, the light is reflected and passes again through the notch 100b, so that the reflective displacement sensor 106a can receive the light.

A distance measured in this way is compared with a preset reference value (a distance between the third finger 72c and the reflective displacement sensor 106a that is preset for the case of carrying out processed wafers), and the difference is within a tolerance range, it is determined that no wafer is placed on the fourth finger 72d.

If the measured distance is largely different from the reference value, it is determined that a wafer is held on the fourth finger 72*d* or there is an error. In this case, the operation of the carrying chamber 12 may be stopped, or an alarm signal may be output for a maintenance worker.

The reflective displacement sensor 114*a* emits light in a direction from the front side of the first finger 72*a* toward the first penetration hole 85 of the first finger 72*a*. As shown in section (a-2), the emitted light passes through the supporting part side 85*b* of the first penetration hole 85 of the first finger 72*a*, and the supporting part side 92*b* of the penetration hole 92 of the second finger 72*b*, and then the light is incident on the supporting part 80 of the third finger 72*c*. Then, the light is reflected from the supporting part 80 of the third finger 72*c* and passes through the supporting part side 92*b* of the penetration hole 92 and the supporting part side 85*b* of the first penetration hole 85, so that the reflective displacement sensor 114*a* can receive the light. A distance measured in this way is compared with a preset reference value (a distance between the third finger 72*c* and the reflective displacement sensor 114*a* that is preset for the case of carrying out processed wafers), and the difference is within a tolerance range, it is determined that no wafer is placed on the third finger 72*c*.

If the measured distance is largely different from the reference value, it is determined that a wafer is held on the third finger 72*c* or there is an error. In this case, the operation of the carrying chamber 12 may be stopped, or an alarm signal may be output for a maintenance worker.

If it is determined that no wafer is placed on the third and fourth fingers 72*c* and 72*d*, the gate valve 35 is opened, as shown in section (b), the lower arm 75 is moved to the process chamber 16*a*. After that, by cooperative operation with the first substrate holding pins 39*a*, the processed wafers of the process chamber 16*a* are transferred to the respective fingers of the lower arm 75.

After the wafers are placed on the fingers of the lower arm 75, as shown in section (c-1), the lower arm 75 is moved to the carrying chamber 12. Thereafter, by using sensors, it is determined whether wafers are placed on the respective fingers of the lower arm 75. Section (c-2) is a view illustrating relationships between the fingers and light (optical axes) output from the sensors at that time.

The reflective displacement sensor 106*a* emits light in a direction from the backside of the fourth finger 72*d* toward the basis of the notch 100*b* of the fourth finger 72*d*. Then, the light is incident on the backside of the wafer held on the fourth finger 72*d*. The light reflected from the backside of the wafer is received by the reflective displacement sensor 106*a*.

A distance measured in this way is compared with the preset reference value (the distance between the third finger 72*c* and the reflective displacement sensor 106*a* that is preset for the case of carrying out wafers), and if the measured distance is different from the reference value, it is determined that a wafer is placed on the fourth finger 72*d*.

If the measured distance is largely different from the reference value and is different from the distance between the fourth finger 72*d* and the reflective displacement sensor 106*a*, it is determined that no wafer is held on the fourth finger 72*d* or there is an error. In this case, the operation of the carrying chamber 12 may be stopped, or an alarm signal may be output for a maintenance worker.

The reflective displacement sensor 114*a* emits light in a direction from the front side of the first finger 72*a* toward the first penetration hole 85 of the first finger 72*a*. As shown in section (c-2), the emitted light passes through the supporting part side 85*b* of the first penetration hole 85 of the first finger 72*a*, and the supporting part side 92*b* of the penetration hole 92 of the second finger 72*b*, and then the light is incident on the wafer held on the third finger 72*c*. Then, the light is reflected from the wafer and passes through the supporting part side 92*b* of the penetration hole 92 and the supporting part side 85*b* of the first penetration hole 85, so that the reflective displacement sensor 114*a* can receive the light.

A distance measured in this way is compared with the preset reference value (the distance between the third finger 72*c* and the reflective displacement sensor 114*a* that is preset for the case of carrying out wafers), and if the difference is out of a tolerance range, it is determined that a wafer is held on the third finger 72*c*.

If the measured distance is largely different from the reference value, it is determined that a wafer is held on the third finger 72*c* or there is an error. In this case, the operation of the carrying chamber 12 may be stopped, or an alarm signal may be output for a maintenance worker.

Next, with reference to FIG. 31, an explanation will be given on a method of transferring wafers, which are transferred to the lower arm 75 as shown in FIG. 30, to the loadlock chamber.

For the state of section (c-1) of FIG. 30 where the leading ends of the fingers are pointed toward the process chamber 16*a*, the first substrate carrying member 70 is rotated together with the upper arm 74 and the lower arm 75 so as to point the leading ends of the fingers toward the loadlock chamber 14*a* as shown in section (a) in FIG. 31.

Thereafter, the gate valve 35 is opened, and the lower arm 75 loaded with the processed wafers is moved toward the loadlock chamber 14*a* as shown in section (b). By cooperative operation with the substrate supporter 20, the processed wafers are transferred to the substrate supporter 20.

In this way, all wafers transferred to the loadlock chamber 14*a* from the EFEM 18 are processed in the process chamber and are returned to the loadlock chamber 14*a*.

After the wafers are transferred to the substrate supporter 20, as shown in section (c-1), the lower arm 74 is moved to the carrying chamber 12.

At this time, it is checked whether no wafer is placed on any of the arms (fingers). That is, the transmissive sensor light projecting unit 110*a* emits light toward a point between the leading ends of the fourth finger 72*d*, and the transmissive sensor light receiving unit 104*a* receives the light if no wafer is placed on any of the arms (fingers).

In this way, it is determined that no wafer is placed on any of the arms.

At this time, if the transmissive sensor light receiving unit 104*a* does not receive light, it is determined that a wafer is placed on at least one of the arms or the apparatus is abnormally operated. In this case, the operation of the carrying chamber 12 may be stopped, or an alarm signal may be output for a maintenance worker.

Next, with reference to FIG. 32, a comparative example will be described.

Figure 32:
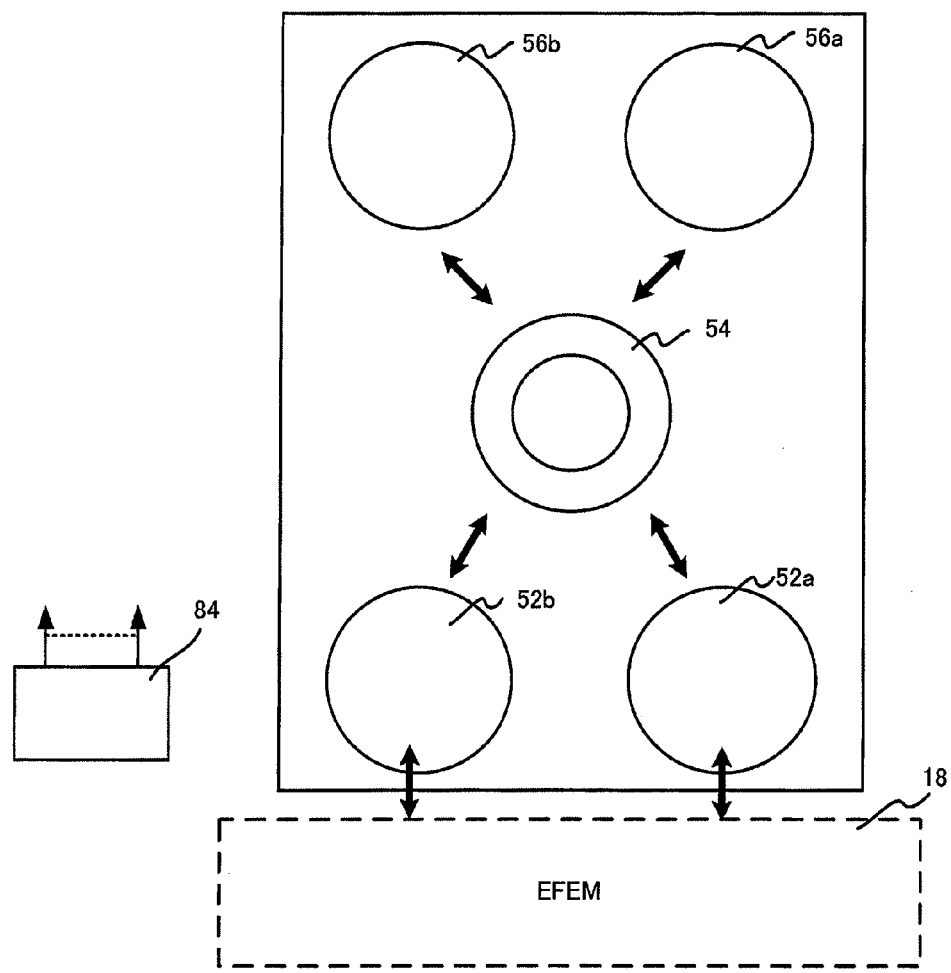
FIG. 32 is a schematic top view illustrating the entire structure of a substrate processing apparatus according to a comparative example.

FIG. 32 is a schematic top view illustrating a substrate processing apparatus 50 according to the comparative example.

In the comparative example, the substrate processing apparatus 50 includes two loadlock chambers 52 configured to be stocked with wafers, a carrying chamber 54 having a robot configured to carry wafers of each chamber, and two process chambers 56 configured to process wafers. In each of the process chambers 56, only one wafer is processed at a time.

Figure 33:
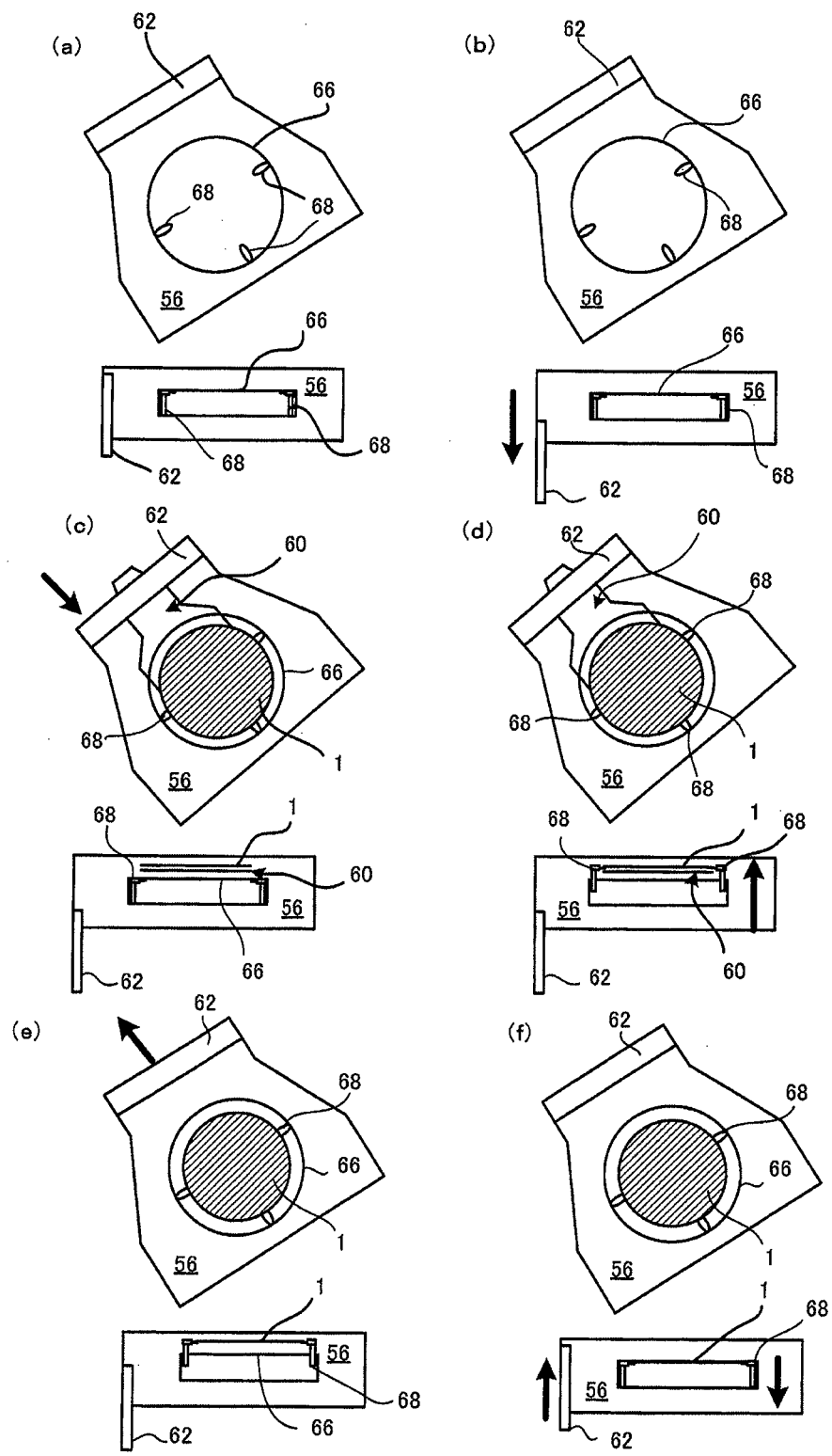
FIG. 33 is a top view illustrating the inside of a process chamber of the substrate processing apparatus of the comparative example, for explaining a wafer transfer flow according to an embodiment of the present invention.

FIG. 33 illustrates a wafer transfer flow in the process chamber 56 of the substrate processing apparatus 50 of the comparative example.

In the following description, each part of the substrate processing apparatus 50 is controlled by a controller 84.

First, the inside of the process chamber 56 is vacuum-evacuated to the same pressure level as that in the carrying chamber 54.

(Step 1)

A gate valve 62 is opened.

(Step 2)

While carrying a wafer 1, a third substrate carrying member 60 is moved from the carrying chamber 54 to the process chamber 56 through the gate valve 62, and then the third substrate carrying member 60 is stopped at a position above a substrate holding stage 66. Here, the third substrate carrying member 60 can carry wafers one by one.

(Step 3)

In a state where the third substrate carrying member 60 is stopped, substrate holding pins 68 are lifted, and the wafer 1 is placed on the substrate holding pins 68.

(Step 4)

The third substrate carrying member 60 returns to the inside of the carrying chamber 54.

(Step 5)

In a state where the wafer 1 is approximately horizontally held, the substrate holding pins 68 are moved downward so as to place the wafer 1 on the substrate holding stage 66, and in this way, wafer placement is completed.

Thereafter, gas is supplied to the inside of the process chamber 56 to generate plasma (for an ashing process), and after wafers are processed, the wafer are carried out in the reverse sequence.

As described above, according to the present invention, arrangement for reducing the footprint is possible as compared with the substrate processing apparatus 50 of the comparative example which is a four reaction chamber apparatus. Furthermore, according to the present invention, since the second substrate carrying member 40 is used in addition to the first substrate carrying member 30 configured to carry wafers from the carrying chamber, the first substrate carrying member 30 and the second substrate carrying member 40 can perform different operations at the same time, and thus high-throughput processing is possible. In addition, since the first substrate carrying member 70 includes two arms each having a finger pair, higher throughput can be attained. In addition, since the second substrate carrying member 40 is disposed in the process chamber 16, a wafer can be carried in the process chamber 16 while maintaining a decompression/high-temperature condition, and if the second substrate carrying member 40 is made of an alumina ceramic material, a processing process can be performed in a state where the second substrate carrying member 40 is left in the process chamber 16. Moreover, since the structure of an existing substrate processing apparatus can be used, things to be changed can be reduced.

Therefore, according to the present invention, while saving footprint or layout, throughput can be increased.

The present invention relates to semiconductor manufacturing technology, particularly, to heat treatment technology for processing a substrate in a state where the substrate is accommodated in a process chamber and heated by a heater. For example, the present invention may be effectively applied to a substrate processing apparatus used to perform a process, such as an oxidation or diffusion process, a reflow or annealing process for carrier activation or planarization after ion implantation, and a thermal-CVD film-forming process, on a semiconductor wafer on which a semiconductor integrated circuit device (semiconductor device) will be formed.

According to an aspect of the present invention, there is provided a substrate processing apparatus including a carrying chamber, and a loadlock chamber and at least two process chambers that are arranged around the carrying chamber, wherein the carrying chamber includes a substrate carrying unit configured to carry a substrate between the loadlock chamber and the process chambers; the substrate carrying unit includes a first arm provided with a first finger and a second finger, and leading ends of the first and second fingers extend horizontally in the same direction; and each of the process chambers includes a first process unit and a second process unit, and the second process unit is disposed at a side of the process chamber distant from the carrying chamber with the first process unit being disposed therebetween. Therefore, at least two substrates can be simultaneously carried into or out.

Preferably, the substrate carrying unit includes a second arm provided with a third finger and a fourth finger, and leading ends of the first to fourth fingers extend horizontally in the same direction. Therefore, since there are arms for respectively carrying a non-processed substrate and a processed substrate, when a processed substrate is carried out from the process chamber, a non-processed substrate can be immediately carried to the process chamber. That is, throughput can be increased.

Preferably, the fingers respectively include resting parts each configured to receive a substrate, and leading ends of the resting parts of a pair of the fingers are not overlapped with leading ends of the resting parts of another pair of the fingers. Therefore, although a substrate is loaded on any of the arms, information such as existence of a non-processed substrate or a processed substrate can be detected by using a substrate detector.

Preferably, each of the fingers includes a resting part configured to place a substrate thereon and a supporting part configured to support the resting part and fix the resting part to the arm. At the first arm, the fingers are vertically arranged by fixing the supporting parts to the first arm. At the second arm, the fingers are vertically arranged by fixing the supporting parts of the fingers to the second arm, and leading ends of the supporting parts are not overlapped with the fingers of the first arm. Owing to this configuration, although a substrate is loaded on any of the arms, information such as existence of a non-processed substrate or a processed substrate can be detected by using a substrate detector.

Preferably, a notch is formed at a leading end of the resting part of one of the fingers which is fixed to a first-arm side of the second arm.

According to another aspect of the present invention, there is provided a substrate carrying device including: first-arm fingers each including a resting part configured to place a substrate thereon and a supporting part configured to support the resting part and fix the resting part to an arm; a first arm at which the first-arm fingers are vertically arranged by fixing the supporting parts of the first-arm fingers to the first arm; second-arm fingers each including a resting part configured to place a substrate thereon, a vertical penetration hole, and a supporting part configured to support the resting part and fix the resting part to an arm; and a second arm at which the second-arm fingers are vertically arranged by fixing the supporting parts of the second-arm fingers to the second arm in a manner that the penetration holes are overlapped with the supporting parts of the first-arm fingers.

Preferably, the penetration holes of the second-arm fingers and the supporting parts of the first-arm fingers are arranged in a row.

Preferably, a substrate is placed on a part of the supporting part which is aligned with the penetration hole in a row.

According to another aspect of the present invention, there is provided a substrate processing apparatus including: a carrying chamber, and a loadlock chamber and a process chamber that are arranged around the carrying chamber, wherein the carrying chamber includes a substrate carrying unit configured to carry a substrate between the loadlock chamber and the process chambers, and a substrate detecting unit; the substrate carrying unit includes fingers each including a resting part configured to place a substrate thereon and a supporting part configured to support the resting part and fix the resting part to an arm, a first arm at which a plurality of the fingers are vertically arranged by fixing the supporting parts of the fingers to the first arm, a second arm at which a plurality of the fingers are vertically arranged by fixing the supporting parts of the fingers to the second arm in a manner that leading ends of the supporting parts are not overlapped with the fingers fixed to the first arm; and the substrate detecting unit is installed at a wall of the carrying chamber such that the first arm is disposed between the substrate detecting unit and the second arm.

Preferably, the substrate detecting unit is installed to face the backside of a substrate, and a notch is formed at a leading end of the resting part of one of the fingers which is fixed to a first-arm side of the second arm.

According to another aspect of the present invention, there is provided a substrate processing apparatus including: a carrying chamber, and a loadlock chamber and a process chamber that are arranged around the carrying chamber, wherein the carrying chamber includes a substrate carrying unit configured to carry a substrate between the loadlock chamber and the process chambers, and a substrate detecting unit; the substrate carrying unit includes first-arm fingers each including a resting part configured to place a substrate thereon and a supporting part configured to support the resting part and fix the resting part to an arm, a first arm at which the first-arm fingers are vertically arranged by fixing the supporting parts of the first-arm fingers to the first arm, second-arm fingers each including a resting part configured to place a substrate thereon, a vertical penetration hole, and a supporting part configured to support the resting part and fix the resting part to an arm, and a second arm at which the second-arm fingers are vertically arranged by fixing the supporting parts of the second-arm fingers to the second arm in a manner that the penetration holes are overlapped with the supporting parts of the first-arm fingers; and the substrate detecting unit is installed at a wall of the carrying chamber such that the second arm is disposed between the substrate detecting unit and the first arm.

What is claimed is:

1. A substrate processing apparatus Comprising;
a carrying chamber;
a loadlock chamber capable of accommodating substrates arranged vertically with an interval therebetween;
at least two process chambers; and
a controller configured to control each component of the substrate processing apparatus,
wherein the loadlock chamber and the at least two process chambers are arranged around the carrying chamber and each of the at least two process chambers comprises a first process unit and a second process unit, the second process unit being disposed at a side of the at least two process chambers distant from the carrying chamber with the first process unit disposed therebetween, and
wherein the carrying chamber comprises a substrate carrying unit configured to carry the substrates between the loadlock chamber and the at least two process chambers, the substrate carrying unit comprising: a first arm provided with a first pair of fingers including a first finger and a second finger arranged vertically, each of the first finger and the second finger being fixed to the first arm via a supporting part with a gap therebetween, each of the first finger and the second finger including a wafer resting part configured to carry one of the substrates arranged vertically, the wafer resting part of each of the first finger and the second finger having a leading end extending horizontally, and the wafer resting part of the second finger having a notch at the leading end thereof, the notch overlapping with the leading end of the first finger; and a second arm vertically stacked with respect to the first arm, the second arm provided with a second pair of fingers including a third finger and a fourth finger arranged vertically, each of the third finger and the fourth finger being fixed to the second arm via a support part with a gap therebetween, each of the third finger and the fourth finger including a wafer resting part configured to carry one of the substrates arranged vertically, the wafer resting part of each of the third finger and the fourth finger having a notch at a leading end thereof extending horizontally, the notch of the fourth finger overlapping with the leading end of the third finger,
wherein each of the first finger and the second finger includes a penetration hole extending over the resting part and the supporting part thereof;
a first reflective displacement sensor disposed at one of a top side and a bottom side of the carrying chamber closer to the first arm such that penetration holes of the first finger and the second finger and the supporting part of the third finger are placed along an optical axis of a first light passing through the penetration holes of the first finger and the second finger with the leading ends of the first finger and the second finger facing one of the at least two process chambers during a carrying operation of the substrates; and
a second reflective displacement sensor disposed at one of the top side and the bottom side of the carrying chamber opposite to the first reflective displacement sensor such that the notch of the fourth finger and a backside of the third finger are placed along an optical axis of a second light passing through the notch of the fourth finger with the leading ends of the first finger and the second finger facing the one of the at least two process chambers during the carrying operation of the substrates.

2. The substrate processing apparatus of claim 1, wherein the controller is configured to: control the first reflective displacement sensor to emit the first light toward the penetration holes of the first finger and the second finger and to receive the first light reflected from the supporting part of the third finger to measure a first distance and the second reflective displacement sensor to emit the second light toward the notch of the fourth finger and the backside of the third finger and to receive the second light reflected from the backside to measure a second distance and the third finger with the leading ends of the first finger and the second finger facing the one of the at least two process chambers during a carrying out operation of processed substrates; determine that the third finger and the fourth finger are without the substrates thereon when a difference between the first distance and a first preset value is within a first tolerance range and a difference between the second distance and a second preset value is with a second tolerance range; and then control the third finger and the fourth finger to carry out the processed substrates from the one of the at least two process chambers.

3. The substrate processing apparatus of claim 1, wherein the controller is configured to:
control the third finger and the fourth finger to carry out processed substrates form the process chamber into the carrying chamber, the first reflective displacement sensor to emit the first light toward the penetration holes of the first finger and the second finger and to receive the first light reflected form the supporting part of the third finger to measure a first distance and the second reflective displacement sensor to emit the second light toward the notch of the fourth finger and the backside of the third finger and to receive the second light reflected from the backside to measure a second distance with each of the first finger and the second finger holding a non-processed substrate, the processed substrates disposed in the process chamber and the leading ends of the first finger and the second finger facing the one of the at least two process chambers during a carrying in operation of the non-processed substrate;
determine that each of the third finger and the fourth finger is holding the non-processed substrate thereon when a difference between the first distance and a first preset value is out of a first tolerance range and a difference between the second distance and a second preset value is out of a second tolerance range; and
then control each of the first finger and the second finger to carry in the non-processed substrate into the one of the at least two process chambers.

4. The substrate processing apparatus of claim 1, wherein the wafer resting part of each of the first finger through the fourth finger is grooved for placing one of the substrates thereon.

5. The substrate processing apparatus of claim 1, wherein a boundary of the wafer resting part and the supporting part of each of the first finger through the fourth finger is curved along a circumference of one of the substrates placed thereon.

* * * * *